US011663378B2

(12) United States Patent
Neubauer

(10) Patent No.: US 11,663,378 B2
(45) Date of Patent: May 30, 2023

(54) METHOD, APPARATUS, AND SYSTEM FOR PROVIDING TRAFFIC SIMULATIONS IN A SMART-CITY INFRASTRUCTURE

(71) Applicant: HERE GLOBAL B.V., Eindhoven (NL)

(72) Inventor: Nicolas Neubauer, Chicago, IL (US)

(73) Assignee: HERE Global B.V., Eindhoven (NL)

( * ) Notice: Subject to any disclaimer, the term of this patent is extended or adjusted under 35 U.S.C. 154(b) by 946 days.

(21) Appl. No.: 16/513,222

(22) Filed: Jul. 16, 2019

(65) Prior Publication Data
US 2021/0019376 A1  Jan. 21, 2021

(51) Int. Cl.
*G06F 30/20* (2020.01)
*G06N 5/04* (2023.01)
*G06N 20/00* (2019.01)
*G08G 1/081* (2006.01)
*G08G 1/01* (2006.01)

(52) U.S. Cl.
CPC ............... *G06F 30/20* (2020.01); *G06N 5/04* (2013.01); *G06N 20/00* (2019.01); *G08G 1/0145* (2013.01); *G08G 1/081* (2013.01)

(58) Field of Classification Search
CPC .......... G06F 30/20; G06N 5/04; G06N 20/00; G08G 1/0145; G08G 1/081
See application file for complete search history.

(56) References Cited

U.S. PATENT DOCUMENTS

| 7,155,376 B2* | 12/2006 | Yang | G08G 1/0129 |
| | | | 701/532 |
| 2002/0062207 A1 | 5/2002 | Faghri | |
| 2010/0070253 A1* | 3/2010 | Hirata | G08G 1/0104 |
| | | | 703/8 |
| 2011/0106416 A1* | 5/2011 | Scofield | G08G 1/0104 |
| | | | 701/119 |

(Continued)

OTHER PUBLICATIONS

Prouzeau et al., "Towards Road Traffic Management with Forecasting on Wall Displays", Nov. 2016, retrieved from https://hal.archives-ouvertes.fr/hal-01370231/document, pp. 1-11.

(Continued)

*Primary Examiner* — Ajay Cattungal
(74) *Attorney, Agent, or Firm* — Ditthavong, Steiner & Mlotkowski

(57) ABSTRACT

An approach is provided for providing data-driven traffic simulations for ad-hoc reconfigurations of a smart-city infrastructure. The approach involves retrieving training traffic data collected from a geographic area supported by the smart-city infrastructure. The approach also involves determining one or more configurations of the smart-city infrastructure corresponding to one or more times at which the training traffic data was collected, wherein the one or more configurations indicate respective states of one or more traffic-related actions supported by the smart-city infrastructure. The approach further involves training a predictive model to predict a traffic-related key performance indicator based on the training traffic data and the one or more (Continued)

configurations, wherein the predictive model is used to predict the traffic-related key performance indicator for a reconfiguration of at least one of the one or more traffic-related actions.

20 Claims, 13 Drawing Sheets

(56) References Cited

U.S. PATENT DOCUMENTS

| | | | |
|---|---|---|---|
| 2020/0082711 A1* | 3/2020 | Bernet | G08G 1/0137 |
| 2020/0284883 A1* | 9/2020 | Ferreira | G01S 17/10 |
| 2021/0133370 A1* | 5/2021 | Sweet | G06F 30/20 |

OTHER PUBLICATIONS

Montero et al., "A Visualization Tool Based on Traffic Simulation for the Analysis and Evaluation of Smart City Policies, Innovative Vehicles and Mobility Concepts", Proceedings of the 2017 Winter Simulation Conference, 2017, retrieved from https://www.informs-sim.org/wsc17papers/includes/files/266.pdf, pp. 3196-3207.

* cited by examiner

100

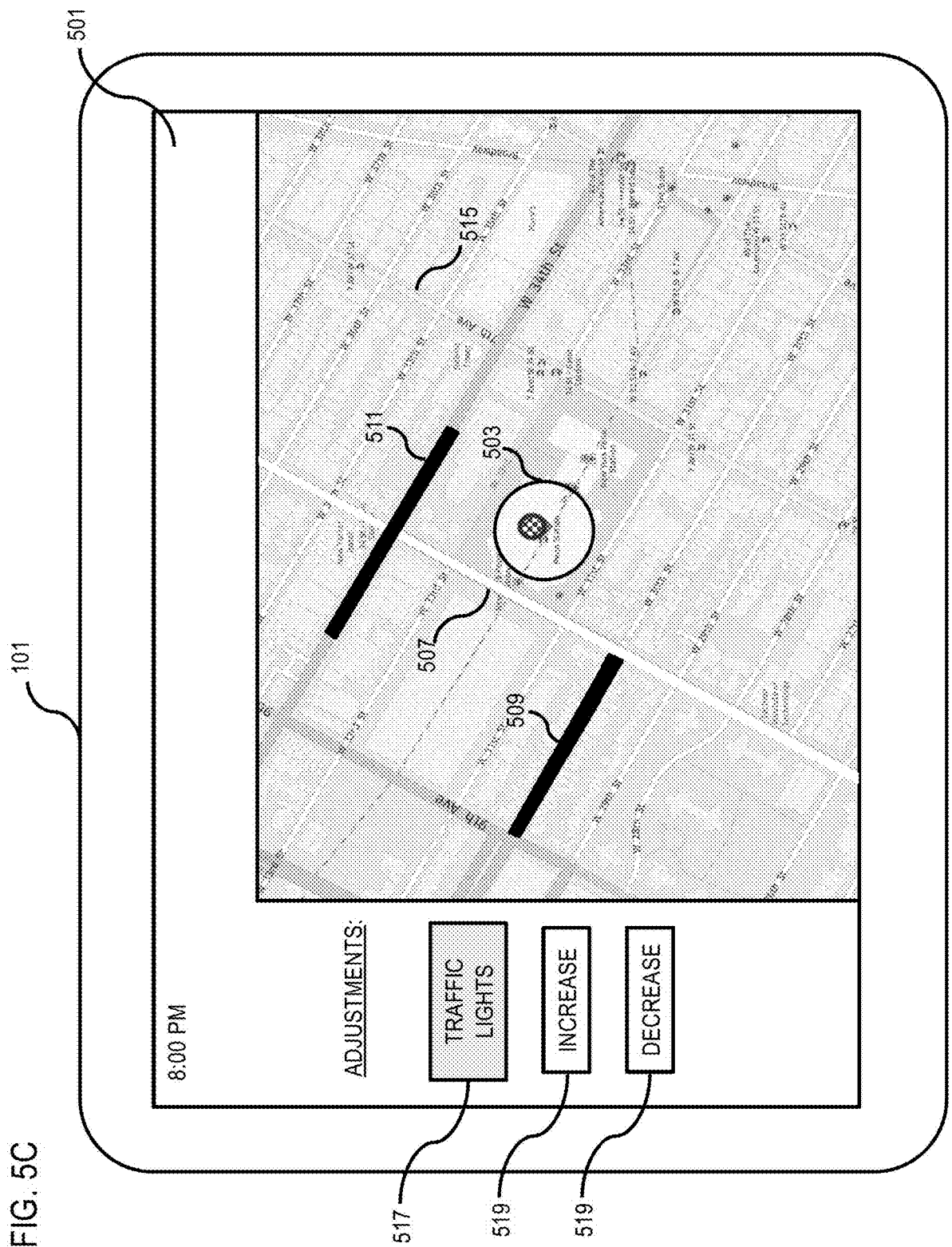

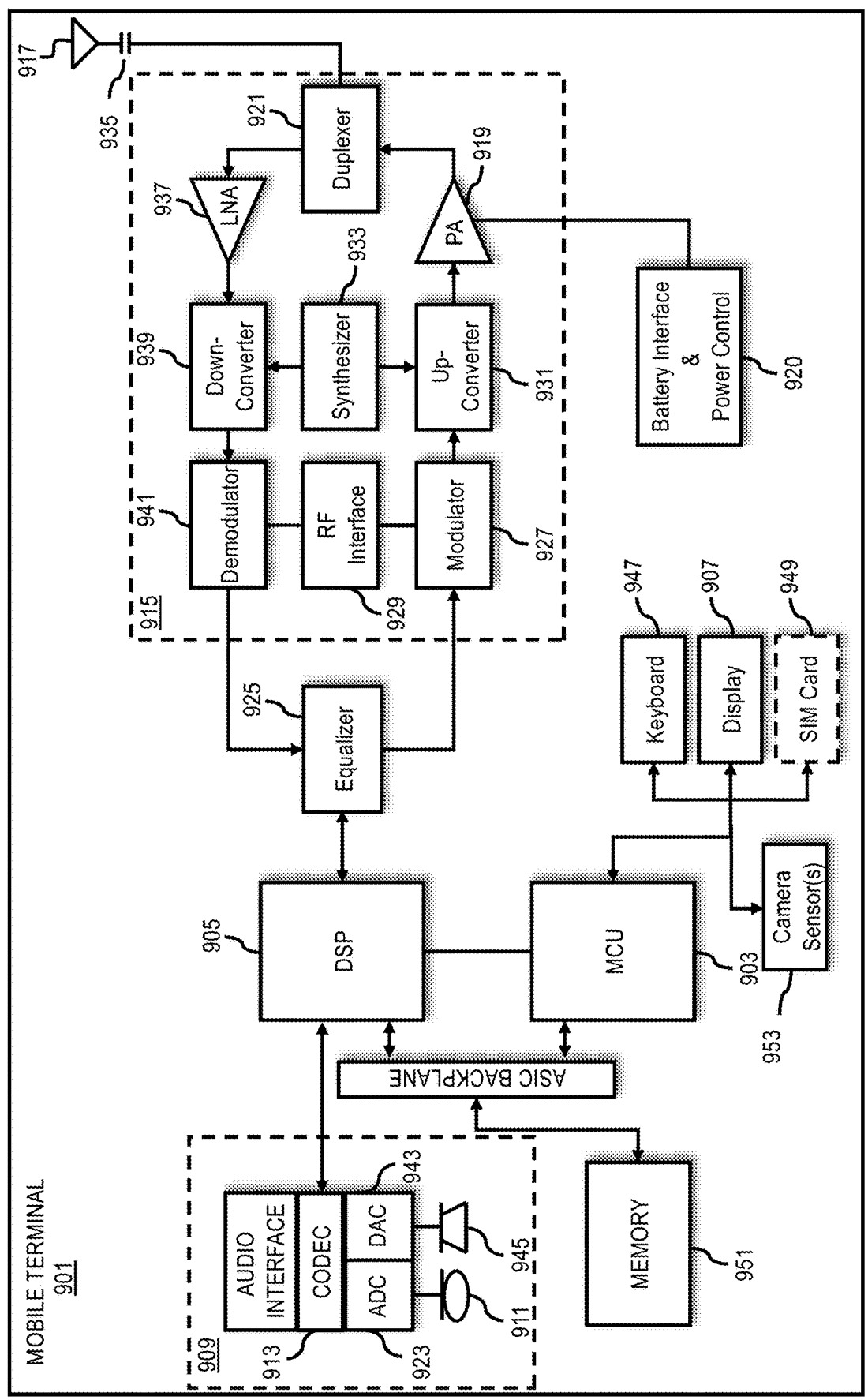

METHOD, APPARATUS, AND SYSTEM FOR PROVIDING TRAFFIC SIMULATIONS IN A SMART-CITY INFRASTRUCTURE

BACKGROUND

Navigation and mapping services providers are continually challenged to provide traffic-based predictions or estimations for increasingly complex and dynamic road networks. One of the most urgent issues to deliver on is to improve the traffic situation which is escalating in many metropoles or cities. For example, highly accurate traffic predictions or estimations can assist users (e.g., traffic authorities) to effectively manage traffic density and/or flow within a city, which is a benefit for citizens. In addition, highly accurate traffic predictions can enable service providers to offer user (e.g., commuters) effective trip planning, routing, and/or estimated time of arrival services. However, traffic predictions are often based on bulk historic traffic data and/or history-based traffic simulation that lacks specific contextualization with respect to what, when, where certain traffic-based actions (e.g., traffic signal timing, road closure, direction rerouting, etc.) may have been taken. Therefore, authorities are unable to effectively determine which actions from a set of possible actions will yield the best results in terms of managing and/or mitigating traffic.

SOME EXAMPLE EMBODIMENTS

Therefore, there is a need for providing high quality traffic predictions and/or traffic simulations that can enable user (e.g., traffic authorities) to effectively make traffic-based decisions to manage and/or mitigate traffic.

According to one embodiment, a computer-implemented method for providing traffic simulation in a smart-city infrastructure comprises retrieving training traffic data collected from a geographic area supported by the smart-city infrastructure. The method also comprises determining one or more configurations of the smart-city infrastructure corresponding to one or more times at which the training traffic data was collected, wherein the one or more configurations indicate respective states of one or more traffic-related actions supported by the smart-city infrastructure. The method further comprises training a predictive model to predict a traffic-related key performance indicator based on the training traffic data and the one or more configurations, wherein the predictive model is used to predict the traffic-related key performance indicator for a reconfiguration of at least one of the one or more traffic-related actions.

According to another embodiment, an apparatus for providing traffic simulation in a smart-city infrastructure comprises at least one processor, and at least one memory including computer program code for one or more computer programs, the at least one memory and the computer program code configured to, with the at least one processor, cause, at least in part, the apparatus to retrieve training traffic data collected from a geographic area supported by the smart-city infrastructure. The apparatus is also caused to determine one or more configurations of the smart-city infrastructure corresponding to one or more times at which the training traffic data was collected, wherein the one or more configurations indicate respective states of one or more traffic-related actions supported by the smart-city infrastructure. The apparatus is further caused to train a predictive model to predict a traffic-related key performance indicator based on the training traffic data and the one or more configurations, wherein the predictive model is used to predict the traffic-related key performance indicator for a reconfiguration of at least one of the one or more traffic-related actions.

According to another embodiment, a non-transitory computer-readable storage medium for providing traffic simulation in a smart-city infrastructure carries one or more sequences of one or more instructions which, when executed by one or more processors, cause, at least in part, an apparatus to perform retrieving training traffic data collected from a geographic area supported by the smart-city infrastructure. The apparatus is also caused to perform determining one or more configurations of the smart-city infrastructure corresponding to one or more times at which the training traffic data was collected, wherein the one or more configurations indicate respective states of one or more traffic-related actions supported by the smart-city infrastructure. The apparatus is further caused to perform training a predictive model to predict a traffic-related key performance indicator based on the training traffic data and the one or more configurations, wherein the traffic-related key performance indicator includes minimizing an overall average traffic density, wherein the predictive model is used to predict the traffic-related key performance indicator for a reconfiguration of at least one of the one or more traffic-related actions.

According to another embodiment, an apparatus for providing traffic simulation in a smart-city infrastructure comprises means for retrieving training traffic data collected from a geographic area supported by the smart-city infrastructure. The apparatus also comprises means for determining one or more configurations of the smart-city infrastructure corresponding to one or more times at which the training traffic data was collected, wherein the one or more configurations indicate respective states of one or more traffic-related actions supported by the smart-city infrastructure. The apparatus further comprises means for training a predictive model to predict a traffic-related key performance indicator based on the training traffic data and the one or more configurations, wherein the predictive model is used to predict the traffic-related key performance indicator for a reconfiguration of at least one of the one or more traffic-related actions.

In addition, for various example embodiments of the invention, the following is applicable: a method comprising facilitating a processing of and/or processing (1) data and/or (2) information and/or (3) at least one signal, the (1) data and/or (2) information and/or (3) at least one signal based, at least in part, on (or derived at least in part from) any one or any combination of methods (or processes) disclosed in this application as relevant to any embodiment of the invention.

For various example embodiments of the invention, the following is also applicable: a method comprising facilitating access to at least one interface configured to allow access to at least one service, the at least one service configured to perform any one or any combination of network or service provider methods (or processes) disclosed in this application.

For various example embodiments of the invention, the following is also applicable: a method comprising facilitating creating and/or facilitating modifying (1) at least one device user interface element and/or (2) at least one device user interface functionality, the (1) at least one device user interface element and/or (2) at least one device user interface functionality based, at least in part, on data and/or information resulting from one or any combination of methods or processes disclosed in this application as relevant to any embodiment of the invention, and/or at least one signal resulting from one or any combination of methods (or processes) disclosed in this application as relevant to any embodiment of the invention.

For various example embodiments of the invention, the following is also applicable: a method comprising creating and/or modifying (1) at least one device user interface element and/or (2) at least one device user interface functionality, the (1) at least one device user interface element and/or (2) at least one device user interface functionality based at least in part on data and/or information resulting from one or any combination of methods (or processes) disclosed in this application as relevant to any embodiment of the invention, and/or at least one signal resulting from one or any combination of methods (or processes) disclosed in this application as relevant to any embodiment of the invention.

In various example embodiments, the methods (or processes) can be accomplished on the service provider side or on the mobile device side or in any shared way between service provider and mobile device with actions being performed on both sides.

For various example embodiments, the following is applicable: An apparatus comprising means for performing the method of any of the claims.

Still other aspects, features, and advantages of the invention are readily apparent from the following detailed description, simply by illustrating a number of particular embodiments and implementations, including the best mode contemplated for carrying out the invention. The invention is also capable of other and different embodiments, and its several details can be modified in various obvious respects, all without departing from the spirit and scope of the invention. Accordingly, the drawings and description are to be regarded as illustrative in nature, and not as restrictive.

BRIEF DESCRIPTION OF THE DRAWINGS

The embodiments of the invention are illustrated by way of example, and not by way of limitation, in the figures of the accompanying drawings:

FIGS. 5A through 5E are diagrams of example user interfaces for providing data-driven traffic simulations in a smart-city infrastructure, according to one embodiment;

FIG. 9 is a diagram of a mobile terminal (e.g., handset or vehicle or part thereof) that can be used to implement an embodiment.

DESCRIPTION OF SOME EMBODIMENTS

Examples of a method, apparatus, and computer program for providing data-driven traffic simulations in a smart-city infrastructure are disclosed. In the following description, for the purposes of explanation, numerous specific details are set forth in order to provide a thorough understanding of the embodiments of the invention. It is apparent, however, to one skilled in the art that the embodiments of the invention may be practiced without these specific details or with an equivalent arrangement. In other instances, well-known structures and devices are shown in block diagram form in order to avoid unnecessarily obscuring the embodiments of the invention.

Figure 1:
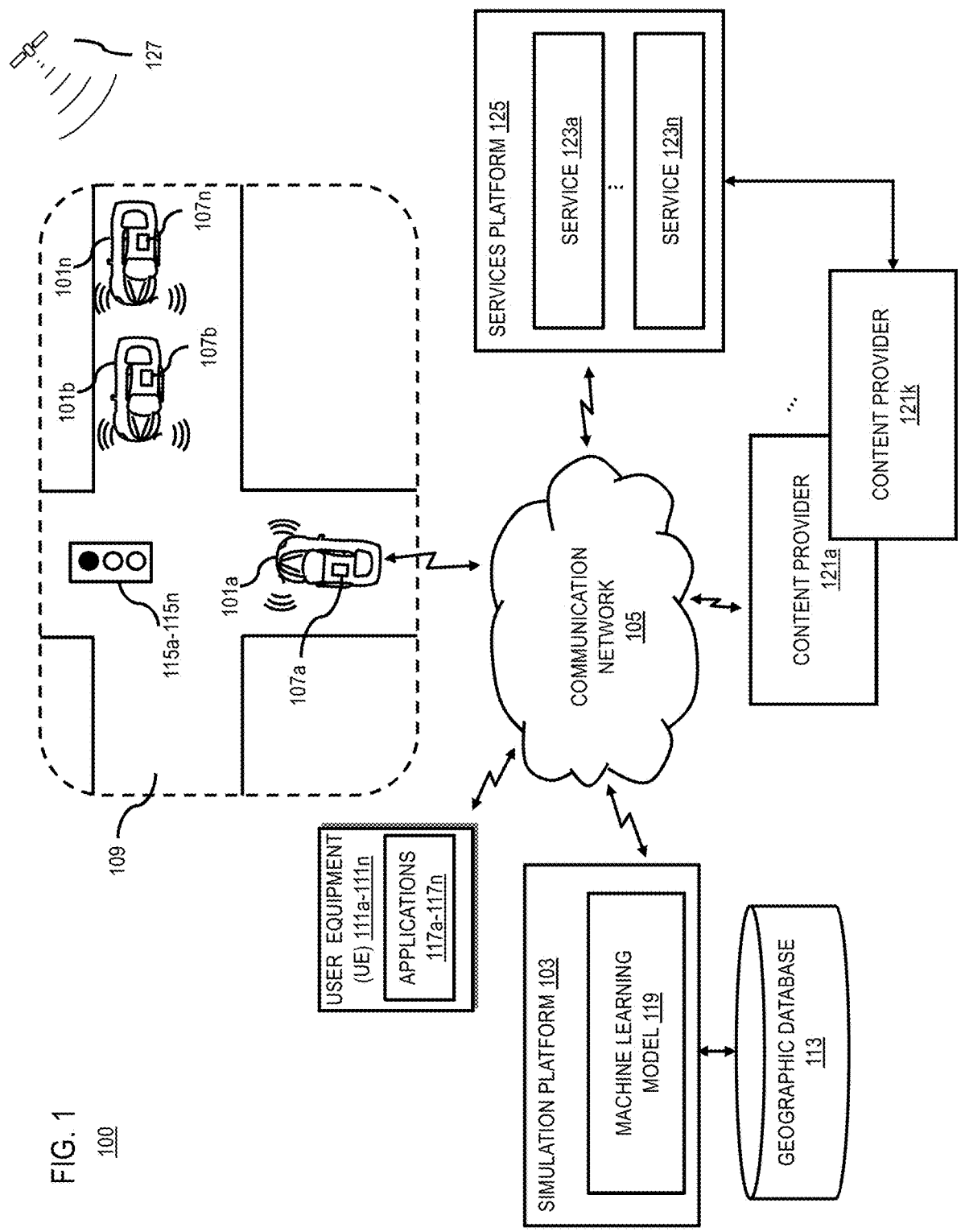
FIG. 1 is a diagram of a system capable of providing data-driven traffic simulations in a smart-city infrastructure, according to one embodiment.

FIG. 1 is a diagram of a system capable of providing data-driven traffic simulations in a smart-city infrastructure, according to one embodiment. As described above, navigation and mapping services providers are continually challenged to provide highly accurate traffic-based predictions or estimations for increasingly complex and dynamic road networks. For example, highly accurate traffic estimations or predictions can assist users (e.g., traffic authorities) to effectively manage and/or mitigate traffic density and/or flow within a city. In addition, such information can assist service providers to offer users (e.g., drivers, commuters, etc.) trip planning, routing, and/or estimated time of arrival services (i.e., navigation services). However, traffic predictions or estimations are often based on bulk historic traffic data and/or history-based traffic simulation without specific contextualization with respect to what, when, and where certain traffic-based actions (e.g., traffic signal timing, road closure, direction rerouting, etc.) may have been taken. For example, the bulk traffic data may lack information identifying that the traffic light cycle for a portion or the entire road network of a city was changed at time (t). Consequently, predicting a probable or resultant traffic density at a future time (e.g., t+1) is challenging at best.

Highly accurate traffic predictions are important to help users (e.g., a traffic authority) know which actions to take with respect to traffic density (e.g., which roads to close, which traffic light cycles to choose, etc.). To help decide which actions to take in general, one could change the corresponding road network model (e.g., a routing graph) to reflect the effect of an action (e.g., closing a road) and then see which predicted traffic densities result from that action. However, this solution is problematic because some actions may not be representable in the routing graph and would not show any changes in the prediction (e.g., changing traffic light cycles). In addition, other actions may have non-trivial side effects not properly captured by a history-based traffic simulation—the assumption that all vehicles will behave according to the routing graph may be wrong.

To address these problems, a system 100 of FIG. 1 introduces a capability to provide data-driven traffic simulations in a smart-city infrastructure, according to one embodiment. The label "Smart Cities" promises the application of new technologies for user's (e.g., citizens) benefits. While "Smart City" can refer to a wide range of technologies, they may be grouped into the following categories: sensors, actions, and logic. By way of example, sensors (e.g., cameras, weather sensors, vehicle counting devices, global positioning system (GPS) probes, etc.) can create inputs for a system managing a city (e.g., a traffic management system). Actions (e.g., traffic light cycles, road closures/lane closures, travel direction changes, dynamic speed limits, dynamic lane assignments, etc.) can influence the state of the city and its infrastructure components. And, logic can create actions based on sensor input and additional factors (e.g., policy considerations).

In one embodiment, the system 100 can improve traffic prediction quality by using additional (contextualized) data available in a Smart City scenario. For example, in one instance, the system 100 can augment historic bulk traffic data with data determined from a city authority (e.g., a traffic manager) about the dynamic state of the traffic systems (e.g., traffic light cycles) at the time the data was collected. In one embodiment, the system 100 can then train or condition a traffic prediction model (e.g., a machine learning model) of the system 100 using the data as an input. In one embodiment, the system 100 can also augment the bulk traffic data with additional or privileged data identifying when changes to the city's infrastructural components were made. For example, the system 100 can tag the data (e.g., collected during configuration 1, collected during configuration 2, etc.) and then use the tagged data as an input for the traffic prediction model (e.g., a machine learning model) instead of simply using bulk traffic data for different configurations. By way of example, the tag (e.g., collected during configuration 1) may be utilized by the system 100 as a label for supervised machine learning. In one embodiment, if available, the system 100 can also use detailed sensor readings of a current traffic situation (e.g., probe data) as an input for the traffic prediction model.

In one embodiment, the system 100 of FIG. 1 may include one or more vehicles 101*a*-101*n* (also collectively referred to herein as vehicles 101) having connectivity to a simulation platform 103 via the communication network 105. In one instance, the vehicles 101 are configured with one or more vehicle sensors 107*a*-107*n* (also collectively referred to herein as vehicle sensors 107) (e.g., GPS probes) to provide the system 100 with historical and/or real-time probe data collected from the vehicles 101 that are and/or have traveled through a road network 109 of a smart city (i.e., a smart-city infrastructure). In one embodiment, the system 100 can also collect the historic and/or real-time probe data from one or more user equipment (UE) 111*a*-111*n* (also collectively referred to as UEs 111) associated with a vehicle 101 (e.g., an embedded navigation system), a user or passenger of a vehicle 101 (e.g., a mobile device, a smartphone, etc.), a pedestrian, or a combination thereof. In one embodiment, the system 100 may store the collected probe data in the geographic database 113.

In one embodiment, the system 100 can predict traffic density on a given road network (e.g., configuration 0) of a city (e.g., time t) using historical traffic data and the corresponding road network model (e.g., a routing graph, a digital map, etc.) using a function: density: road segment, time_interval→traffic density.

In one embodiment, the system 100 can expand upon this rudimentary prediction by taking into consideration on one or more actions (e.g., "action N") that a city authority (e.g., a traffic manager) can take to influence traffic density and/or flow within a given road network (e.g., the road network 109) of the city. In one embodiment, the system 100 includes one or more infrastructure sensors 115*a*-115*n* (also collectively referred to herein as infrastructures sensors 115) (e.g., smart traffic lights or signals) connected to the simulation platform 103 via the communication network 105. In one instance, a city authority may use the one or more infrastructure sensors 115 to manipulate and/or to influence the state of the city and its infrastructural components (e.g., the road network 109). In one instance, the UEs 111 may include one or more applications 117*a*-117*n* (also collectively referred to herein as applications 117) (e.g., a navigation application) that a city authority may also use to implement one or more traffic-based actions (e.g., close or open roads). By way of example, a city authority may use one or more infrastructure sensors 115 and/or applications 117 to take one or more of the following actions to influence the city infrastructure: (a) reassign the direction of lanes for multi-lane roads; (b) close or open roads; (c) change speed limits; or (d) change traffic light cycles.

In one embodiment, the system 100 can define the one or more actions or measures taken relative to the road network of a smart-city (e.g., road network 109) as a set of variables describing those measures or a configuration. By way of example, a configuration (e.g., Configuration 1) may be based on the following variables:

```
{
  num_lanes(road_A) = (2, 3),
  opened(road_B) = true,
  speed_limit(road_C) = 30,
  speed_limit(road_D) = 50
}
```

In one embodiment, the system 100 can then predict the traffic density on a road network based on the contextualized traffic data (e.g., separated per configuration) rather than based on bulk traffic data as follows: density_conditional: road segment, time_interval, configuration→traffic density.

In one embodiment, the system 100 can generate the prediction by training a machine learning classifier or model 119 (e.g., a support vector machine (SVM), neural network, decision tree, etc.) of the simulation platform 103 separately per configuration, using only training data that the system 100 obtained (e.g., by a vehicle 101) or retrieved (e.g., from the geographic database 113) under the corresponding configuration (e.g., Configuration 1) and taking into account a hypothetical road network model (e.g., a routing graph) reflecting that configuration. In one instance, the result of the prediction is a key performance indicator (KPI). By way of example, the system 100 trained exclusively on the training data collected during configuration 1 can predict traffic at time t+1 after action 1 resulting in a corresponding predicted KPI (e.g., predicted KPI 1).

In one embodiment, the system 100 can determine or derive a score reflecting a city authority's interest which can be derived from traffic density (e.g., KPIs). By way of example, the city authority's interest may be minimizing the overall average traffic density, which the system 100 can represent using a function: global_city_score(configuration, time_span)→score. One instance of that function may be minimizing the number of street segments with extreme traffic density/traffic jams, which the system 100 can represent using the formula:

global_city_score(configuration, time_span)=sum (road_segment in road_segments) sum (time_interval in time_span) density_conditional (road_segment, time_interval, configuration)

In one embodiment, the system 100 can then generate proposed measures or recommendations (e.g., changes to a configuration) to optimize traffic for a future time span (e.g., the next hour) using the following formulas:

best_configuration(time_span, score_function)=argmax(configuration)score_function(configuration, time_span)

proposed_measures(time_span, score_function, current_configuration)=set_difference(current_configuration, best_configuration(time_span, score_function)

In one instance, the system 100 can also assign weights, correlations, relationships, etc. to each predicted KPI (e.g., predicted KPI 1, predicted KPI 2, etc.) based on each predicted KPI relative to the determined score for the purpose of training the machine learning model 119 to pick or to recommend an action that promises the best KPI value.

In one embodiment, the system 100 can also evaluate proposed measures, actions, and/or configurations relative to a city authority's interest before enough configuration specific training data has been collected by the system 100 (e.g., by vehicles 101, UEs 111, or a combination thereof). By way of example, such instances may include: (a) when the processes of the system 100 are implemented for the first time; (b) when hypothetical new measures are being explored (e.g., changing speed limits on a road segment where no speed limit change has been applied before); and (c) when considering more long-term changes, like building a new road.

In one embodiment, the system 100 would split training data by configuration in the process described above (e.g., training data collected during configuration 1, training data collected during configuration 2, etc.) and, therefore, having too many configurations may lead to training data becoming too sparse. In one embodiment, to avoid a combinatorial explosion of configurations, the system 100 could exclude one or more configurations and, therefore, not further split the training data when the corresponding values (e.g., average speed) in a target area are below a threshold difference with what they would be in the absence of the configuration (e.g., configuration 0). As such, the system 100 could ensure a local prediction, which would be agnostic of splits in the training data caused by configurations outside a given range. In short, whether a small road A of the road network 109 is closed should not affect the system 100's traffic prediction of another road B of the same road network, if the road A is located on the other end of the city or road network 109. In one embodiment, when training the machine learning model 119 for road B, the system 100 would include training data for both configurations (A=closed, A=open) if distance(A, B)>threshold, where the threshold may be based on a given range, degree of proximity, Euclidean distance, distance in the routing graph or road network model (e.g., a digital map), or a combination thereof.

Consequently, it is contemplated that the evaluation of outcomes from potential traffic management actions by the system 100 should produce more precise traffic predictions relative to traffic predictions based on bulk traffic data. Moreover, in one embodiment, the system 100 can learn over time (e.g., based on the machine learning model 119). Thus, its traffic prediction accuracy is likely to improve because any new data records would be annotated with the city's configuration, thereby improving the system 100's data foundation. Further, in one instance, the system 100 can also enable city authorities (e.g., traffic managers) to experiment with actions to influence infrastructure components, to let the system 100 learn the resultant outcome, and then to propose implementation of such actions if deemed useful (i.e., consistent with a city authority interest).

Figure 2:
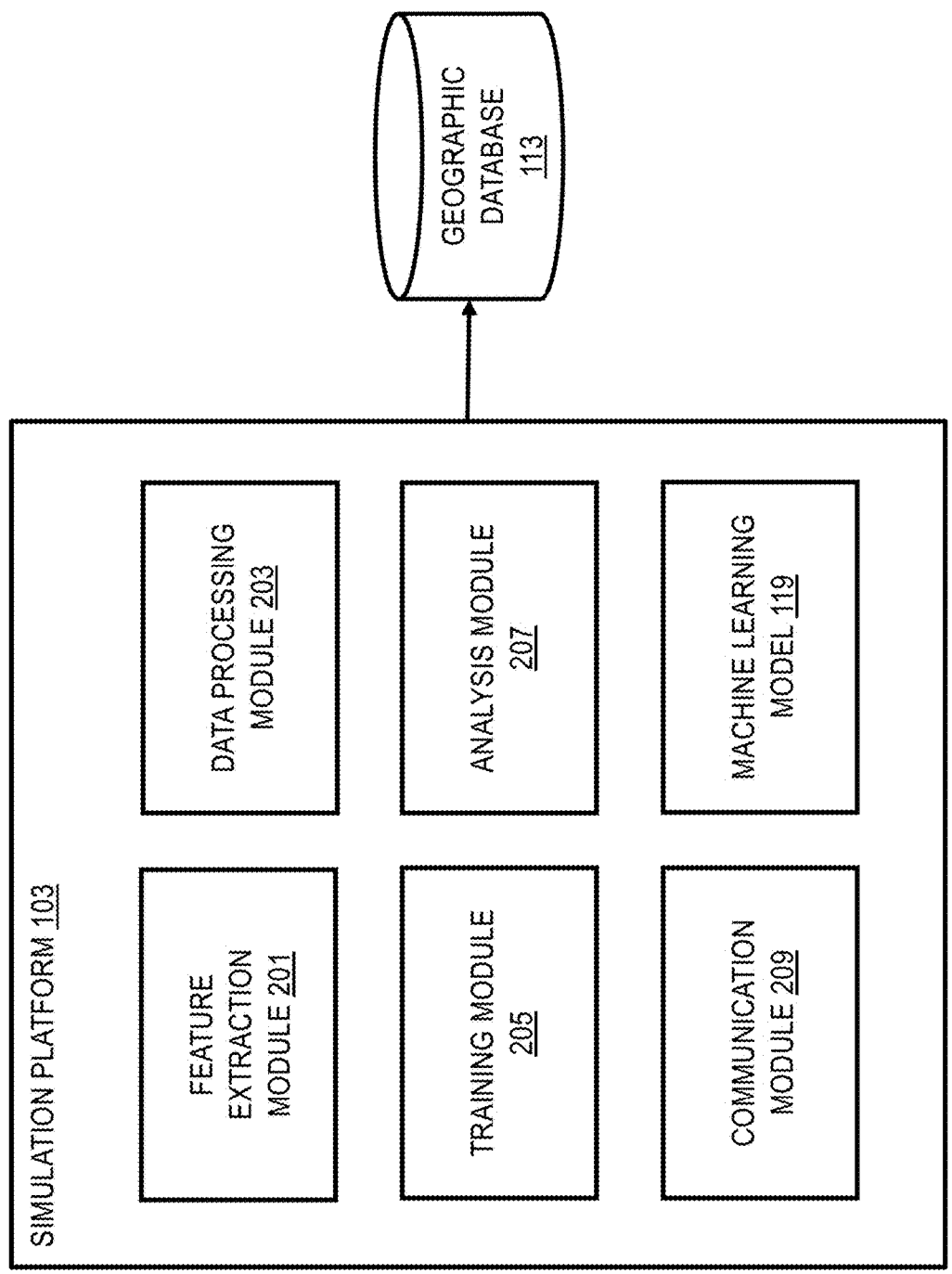
FIG. 2 is a diagram of the components of a simulation platform, according to one embodiment.

FIG. 2 is a diagram of the components of the simulation platform 103, according to one embodiment. By way of example, the simulation platform 103 includes one or more components for providing data-driven traffic simulations in a smart-city infrastructure. It is contemplated that the functions of these components may be combined in one or more components or performed by other components of equivalent functionality. In one embodiment, the simulation platform 103 includes a feature extraction module 201, a data processing module 203, a training module 205, an analysis module 207, a communication module 209, and the machine learning model 119 with connectivity to the geographic database 111. The above presented modules and components of the simulation platform 103 can be implemented in hardware, firmware, software, or a combination thereof. Though depicted as separate entities in FIG. 1, it is contemplated that the simulation platform 103 may be implemented as a module of any of the components of the system 100. In another embodiment, the simulation platform 103 and/or one or more of the modules 201-209 may be implemented as a cloud-based service, local service, native application, or combination thereof. The functions of the simulation platform 103, the machine learning model 119, and/or the modules 201-209 are discussed with respect to FIGS. 3 and 4.

Figure 3:
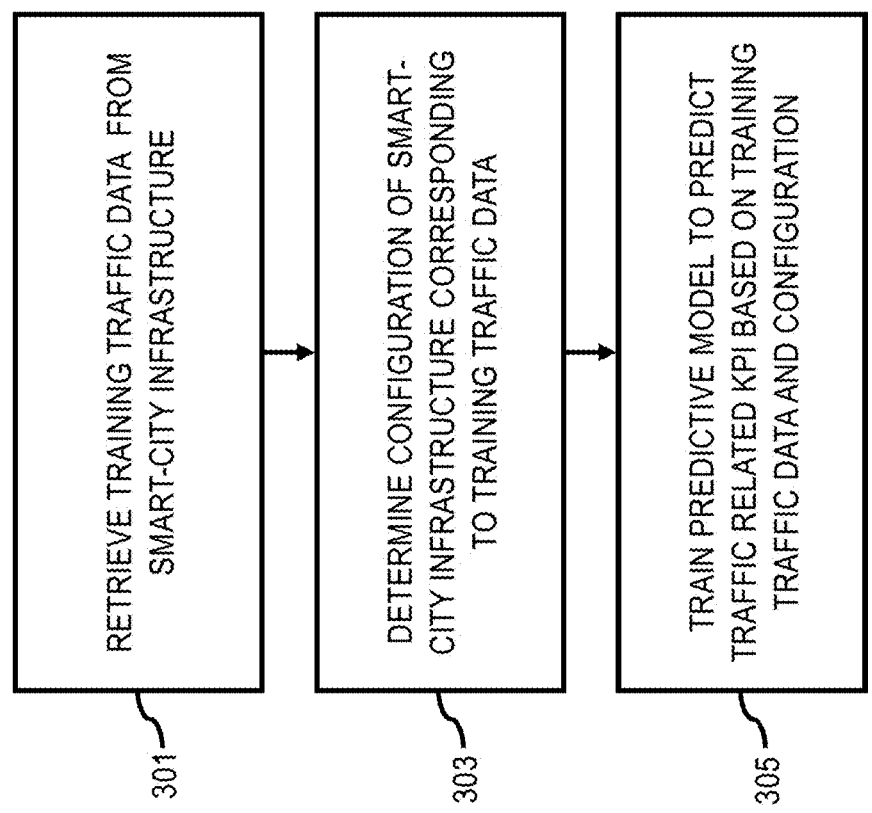
FIG. 3 is a flowchart of a process for providing data-driven traffic simulations in a smart-city infrastructure, according to one embodiment.
Figure 8:
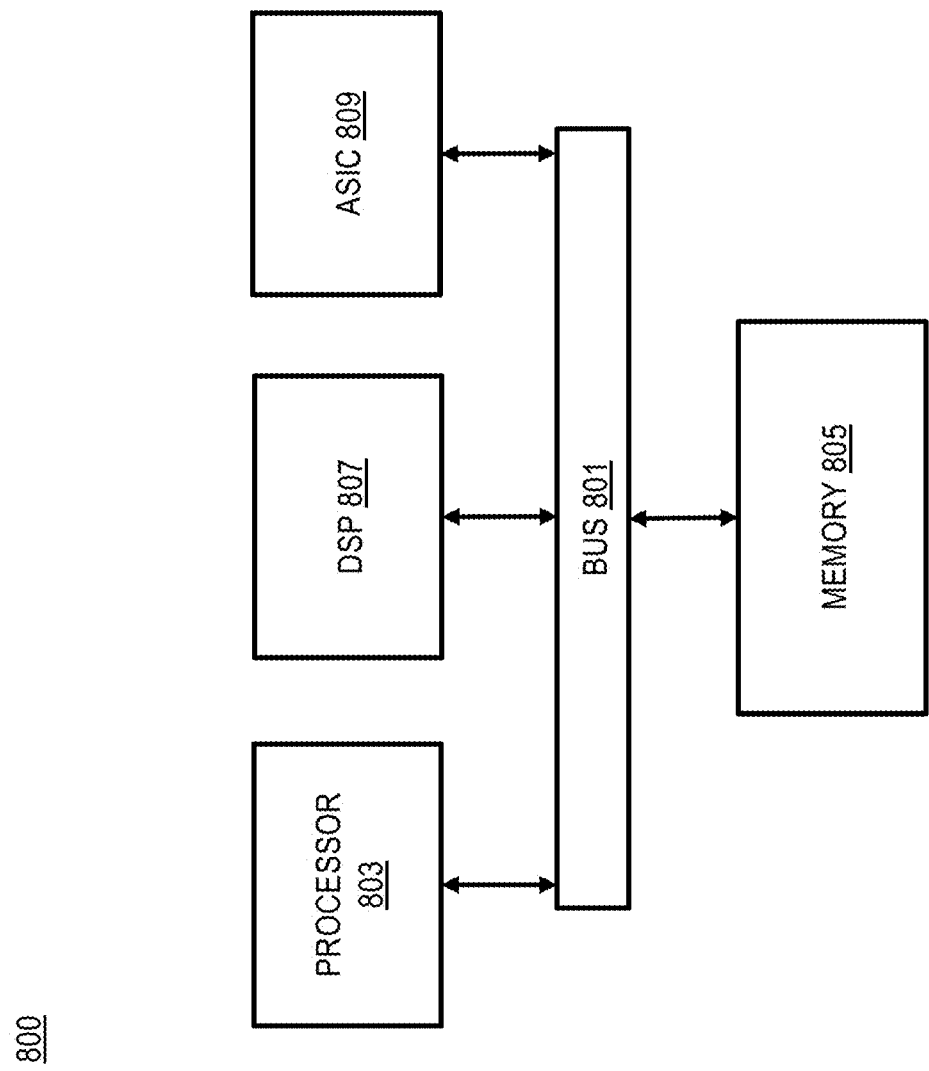
FIG. 8 is a diagram of a chip set that can be used to implement an embodiment.

FIG. 3 is a flowchart of a process for providing data-driven traffic simulations in a smart-city infrastructure, according to one embodiment. In various embodiments, the simulation platform 103, the machine learning model 119, and/or the modules 201-209 may perform one or more portions of the process 300 and may be implemented in, for instance, a chip set including a processor and a memory as shown in FIG. 8. As such, the simulation platform 103, the machine learning model 119, and/or modules 201-209 can provide means for accomplishing various parts of the process 300, as well as means for accomplishing embodiments of other processes described herein in conjunction with other components of the system 100. Although the process 300 is illustrated and described as a sequence of steps, it is contemplated that various embodiments of the process 300 may be performed in any order or combination and need not include all of the illustrated steps.

In step 301, the feature extraction module 201 retrieves training traffic data collected from a geographic area supported by a smart-city infrastructure. By way of example, the training traffic data may be data derived from one or more vehicles (e.g., a GPS sensor 107), one or more users (e.g., via a UE 111), or a combination thereof traveling and/or having traveled through the geographic area (e.g., the road network 109) of a smart city. In one instance, the feature extraction module 201 retrieves the training traffic data from the geographic database 113. By way of example, the smart-city infrastructure is any infrastructure that includes one or more infrastructure devices 115 (e.g., a traffic light), wherein the dynamic state of the device can be observed and/or controlled to obtain knowledge about the dynamic state of the traffic systems at that time (e.g., traffic light cycles) and to take one or more actions to influence the state of the city and its infrastructural components (e.g., road closures, travel direction changes, etc.).

In step 303, the feature extraction module 201 determines one or more configurations of the smart-city infrastructure corresponding to one or more times at which the training traffic data was collected, wherein the one or more configurations indicate respective states of one or more traffic-related actions supported by the smart-city infrastructure. By way of example, the feature extraction module 201 can determine the one or more configurations (i.e., set of variables) from a central traffic authority (e.g., one or more content providers 121a-121k, one or more services 123a-123m of the services platform 125, or a combination thereof) that has privileged information and/or knowledge as to the dynamic state of the traffic systems at the time that the corresponding training traffic data was collected (i.e., privileged data). In one embodiment, the one or more traffic-related actions include at least one of re-assigning a direction of a road lane (e.g., a road lane of the road network 109); closing or opening a road; changing a speed limit; and changing a traffic light cycle. By way of example, the feature extraction module 201 can determine that the example Configuration 1 as described above indicated the following states of traffic-related actions when the training traffic data was collected (e.g., for Configuration 1): road A has 2,3 lanes; road B is open; the speed limit of road C is 30 miles per hour (mph); and the speed limit on road D is 50 mph.

In one embodiment, the analysis module 207 can determine whether a value of the training traffic data (e.g., average speeds) changes with an alternation of one or more configurations of the smart-city infrastructure (e.g., Configuration 1 versus Configuration 2). In instances where the analysis module 207 determines that the change of the value is below a threshold, the training module 205 can exclude the corresponding training traffic data, the one or more configurations, or a combination thereof from the subsequent training of the predictive model (e.g., a machine learning model 119). In one embodiment, the threshold may be based on a given range, proximity, Euclidean distance, routing graph distance, or a combination thereof to ensure a local prediction. In other words, the training module 205 excludes the one or more configurations that may have little or no impact on the road network in the target area. In one instance, the feature extraction module 201 retrieves the training traffic data from one source (e.g., the geographic database 113) and retrieves the one or more configurations from a second source (e.g., a content provider 121).

In step 305, the training module 205 trains a predictive model (e.g., a machine learning model 119) to predict a traffic-related key performance indicator (KPI) based on the training traffic data and the one or more configurations, wherein the predictive model is used to predict the traffic-related KPI for a reconfiguration of at least one of the one or more traffic-related actions. In one embodiment, the training module 205 trains the predictive model (e.g., the machine learning model 119) separately for a corresponding configuration of the one or more configurations. By way of example, the training module 205 can train the machine learning model 119 by assigning weights, correlations, relationships, etc. among the input features (e.g., training traffic data) such that machine learning model 119 processes the training data collected during one configuration (e.g., Configuration 1) to a statistically sufficient exclusion of the training data collected during other configurations (e.g., Configuration 2, Configuration 3, Configuration 0, etc.). In one embodiment, the traffic-related KPI includes at least one of minimizing an overall average traffic density; and minimizing a number of street segments with a traffic density above a threshold value. By way of example, the machine learning model 119 can predict a traffic-related KPI for each set of traffic-related actions and/or corresponding configurations.

In one embodiment, wherein the amount of training traffic data that is available in the geographic area (e.g., the road network 109) is below a threshold value, the training module 203 can use a routing graph (e.g., stored in the geographic database 113) or similar road network model in place of the training traffic data to train the predictive model (e.g., the machine learning model 119). In one embodiment, the analysis module 207 determines that the amount of the training traffic data is below the threshold based on a proxy condition, wherein the proxy condition includes at least one of: an initial start of the system 100; an evaluation of a hypothetical new action (e.g., adjusting a traffic light cycle); and a consideration of a long-term change (e.g., building a new road).

Figure 4:
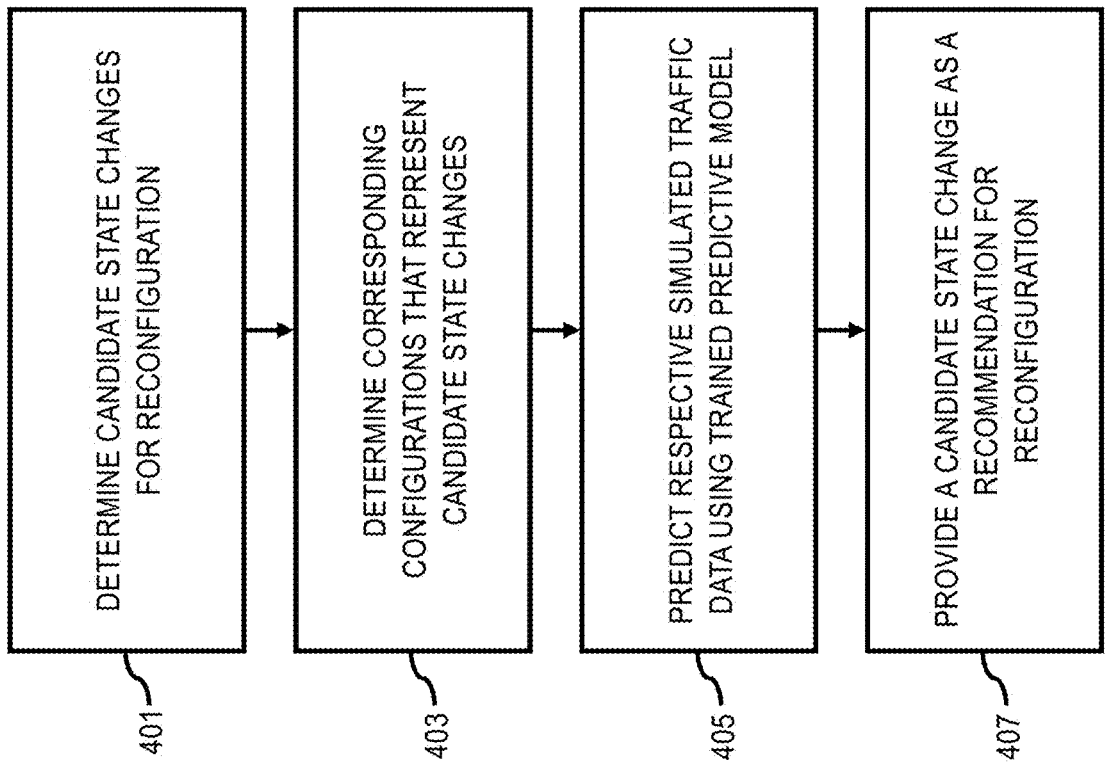
FIG. 4 is a flowchart of a process for training a machine learning model to classify or predict traffic based on data that was collected when certain traffic management measures were in effect, according to one embodiment.

FIG. 4 is a flowchart of a process for training a machine learning model to classify or predict traffic based on data that was collected when certain traffic measurement measures were in effect, according to one embodiment. In various embodiments, the simulation platform 103, the machine learning model 119, and/or the modules 201-209 may perform one or more portions of the process 400 and may be implemented in, for instance, a chip set including a processor and a memory as shown in FIG. 8. As such, the simulation platform 103, the machine learning model 119, and/or modules 201-209 can provide means for accomplishing various parts of the process 400, as well as means for accomplishing embodiments of other processes described herein in conjunction with other components of the system 100. Although the process 400 is illustrated and described as a sequence of steps, it is contemplated that various embodiments of the process 400 may be performed in any order or combination and need not include all of the illustrated steps. In one embodiment, the process 400 describes additional steps that can be performed in combination with the process 300 described above.

In step 401, a traffic authority (e.g., an individual or an institution) can determine one or more candidate state changes for a reconfiguration and the machine learning model 119 can then compare the different candidates. By way of example, the training module 205 can assign a weight, a correlation, a relationship, etc. to each candidate state based on an impact or influence the state is likely to have on the reconfiguration. In one embodiment, the machine learning model 119 can iteratively process the inputs to determine which of the candidate states is most consistent with the desired reconfiguration. In one instance, the analysis module 207 can also determine the one or more candidate states if the one or more states were previously stored in or accessible via the geographic database 113 and includes tags, annotations, or a combination thereof corresponding to the reconfiguration.

In step 403, the machine learning model 119 can determine a corresponding configuration from the one or more configurations that represent the one or more candidate state changes. By way of example, the training module 205 can assign a weight, a correlation, a relationship, etc. to each configuration based on a correspondence or relationship between a configuration and a state. For example, the training module 205 may determine the relationship based on one or more statistical models (e.g., regression analysis). In one embodiment, the machine learning model 119 can then iteratively process the inputs to determine which configuration best represents the set of state changes.

In step 405, the trained machine learning model 119 predicts respective simulated traffic data at a designated future time after each of the one or more candidate state changes are applied to the smart-city infrastructure and it predicts a respective traffic-related KPI for said each of the one or more candidate state changes based on the respective simulated traffic data. By way of example, the machine learning model 119 is trained separately per configuration determined in step 403 above. In one instance, the predicted simulated traffic data represents the predicted traffic after time t+1 after action N as described above. Further, in one embodiment, each predicted traffic-related KPI corresponds to a weight, a correspondence, a proximity, etc. between the simulated traffic data and the reconfiguration determined in step 305 above such that the closer the simulated traffic data is to achieving the desired reconfiguration, the better the KPI value.

In step 407, the communication module 207 provides at least one of the one or more candidate state changes as a recommendation for the reconfiguration based on the respective traffic-related KPI for said each of the one or more candidate state changes. By way of example, the communication module 207 can provide the one or more recommended state changes (e.g., increasing or decreasing traffic light cycles) via an application 117 (e.g., a navigation application) of an UE 111 (e.g., a client terminal) to a user (e.g., a traffic authority) such that the user can have a high degree of confidence that modifying the traffic light cycles in accordance with the simulated traffic will likely achieve the desired reconfiguration.

Figure 5A:
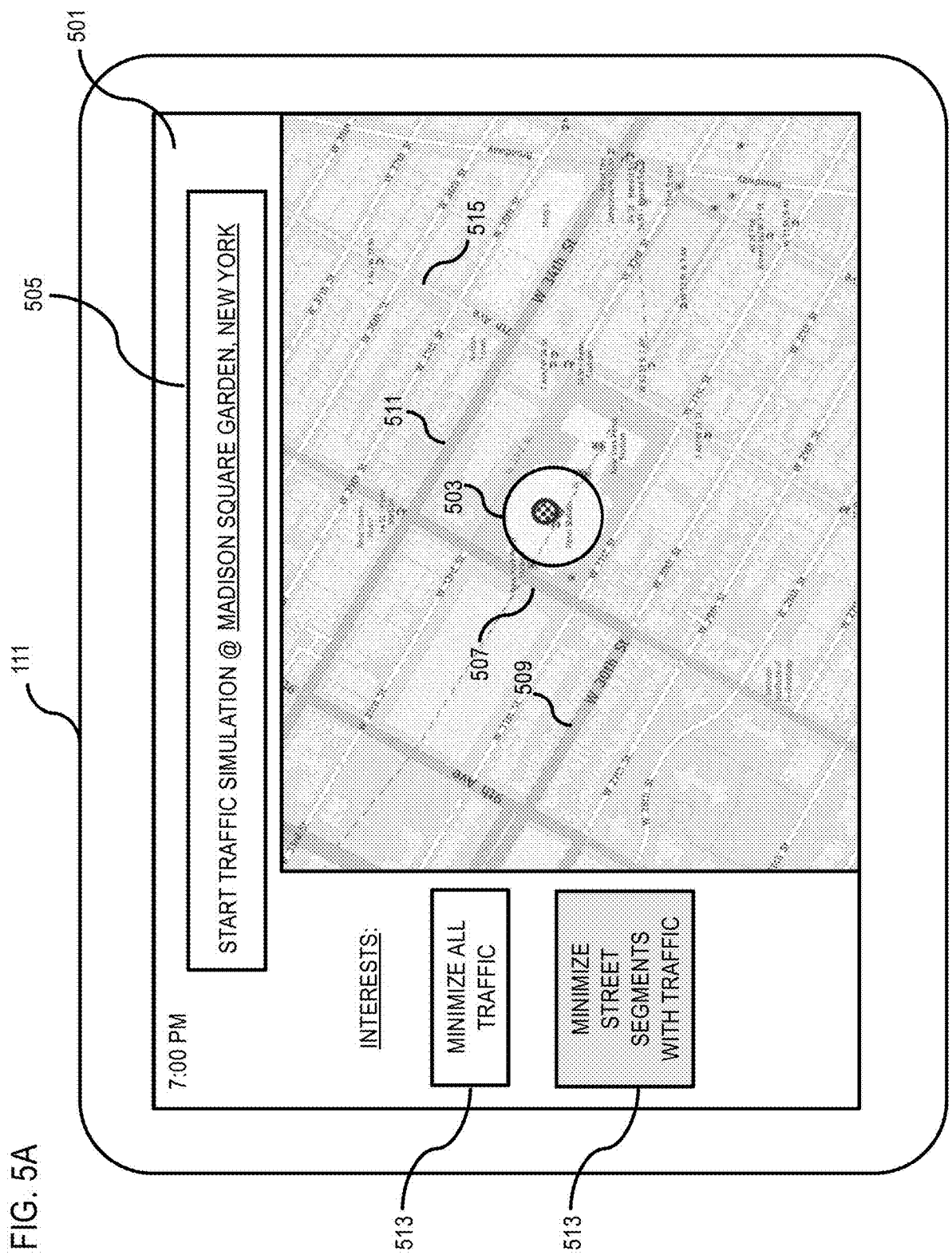

FIGS. 5A through 5E are diagrams of example user interfaces for providing data-driven traffic simulations in a smart-city infrastructure, according to one embodiment. Referring to FIG. 5A, a UI 501 (e.g., a routing application 117) is generated for a UE 111 (e.g., a mobile device, a client terminal, etc.) that enables a user (e.g., a traffic authority) to simulate traffic based on an ad-hoc selection of actions in various situations, to learn along with the system 100 the likely outcomes of such actions in terms of traffic density and/or flow, and to record or to catalogue such actions for later use if deemed helpful. In this example, a user (e.g., a traffic authority) wants to simulate the traffic density and/or flow at a stadium 503 located in the center of a dense urban environment (e.g., New York City). Moreover, the user wants to simulate the traffic flow at a time that may have the greatest impact or influence on the traffic proximate to the stadium 503 (e.g., at the start and/or end of a sport or entertainment event). In this example, a basketball game is starting at 7:00 PM on a weeknight.

As with many cities, roads and routes in a city center can become easily congested with traffic during most of the day and night. This is particularly true when large numbers of individuals (e.g., spectators) are attempting to simultaneously arrive at or depart (e.g., by car, taxi, bus, bicycle, scooter, etc.) from a stadium (e.g., stadium 503). Given the dynamic nature of city traffic-heightened in this instance-and the numerous infrastructural components at play; an authority controlling the traffic management around the stadium 503 may certainly want to understand as effectively and efficiently as possible which set of possible actions will yield the best result in terms of traffic density and/or flow.

In one embodiment, the system 100 generates the UI 501 such that it includes an input 505 (e.g., "start traffic simulation @") to enable a user to center or focus the UI 501 on a specific geographic area within a smart-city infrastructure via one or more physical interactions (e.g., a touch, a tap, a gesture, typing); one or more voice commands (e.g., "Madison Square Garden, New York"); or a combination thereof. In one embodiment, the system 100 can also generate the UI 501 such that it includes an input 513 to allow a user to similarly input one or more interests or goals for simulating traffic in the first place. For example, a user such as a traffic authority may want to "minimize the overall average traffic density" for the given area or road network or the user may want to "minimize the number of street segments with extreme traffic density" (i.e., traffic jams). In this example, the user can see based on the relatively darker shading that the avenue 507 (e.g., $8^{th}$ Avenue) and the streets 509 and 511 (e.g., W $30^{th}$ Street and W $34^{th}$ Street, respectively) are congested at the time of the event (e.g., relative to the majority of other routes such as avenue 515). Therefore, the user has selected to "minimize street segments with traffic," as depicted by the shaded input 515

Figure 5B:
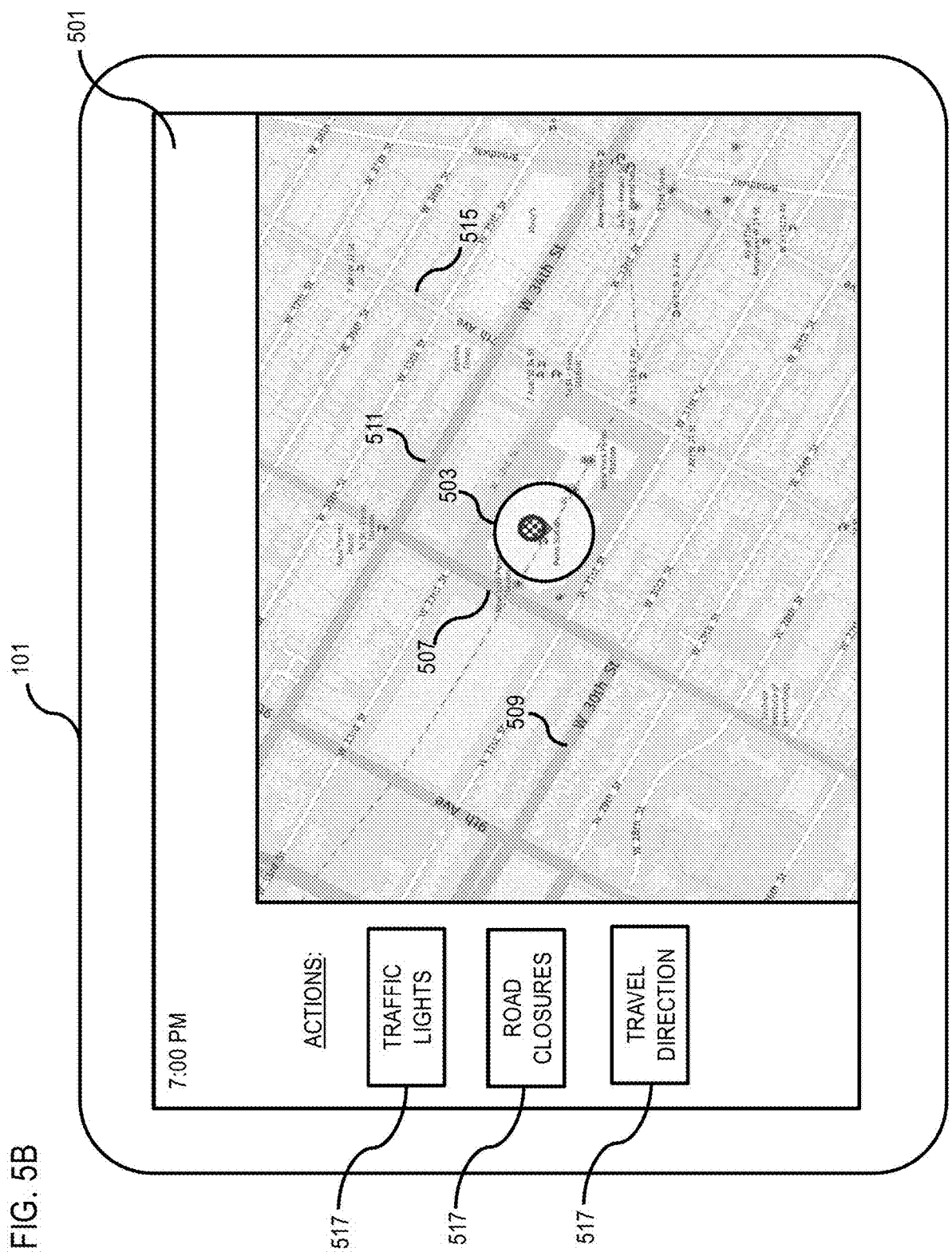

In one embodiment, the system 100 generates the UI 501 such that it also includes inputs 517 that can enable a user to select one or more actions (e.g., traffic light cycles, road closures/lane closures, travel direction changes, dynamic speed limits, dynamic lane assignments, etc.) to influence the state of the city and its infrastructural components. In this example, the user may choose one or more of the following actions: traffic light cycles, road closures, and travel direction changes, as depicted in FIG. 5B.

In this use case example it should be noted that the system 100 has already retrieved the collected training traffic data for the area around the stadium 503 (e.g., from vehicles 101 and stored in the geographic database 113); determined one or more configurations based on the collected traffic data; and trained a prediction model (e.g., the machine learning model 119) based on the training traffic data and the one or more configurations, as described in detail above. In this example, the system 100 can consequently simulate the traffic surrounding the stadium 503 based on three configurations. For example, Configuration 1 consists of "traffic lights—fast;" Configuration 2 consists of "traffic lights—fast" and "road closures—minimal;" and Configuration 3 consists of "traffic lights—fast," and "travel direction—opposite."

Referring to FIG. 5C (Configuration 1), in one embodiment, the system 100 can further generate the UI 501 such that it includes input 519 to enable a user to incrementally adjust the selected action 517 (e.g., increase or decrease the traffic light cycle). In one embodiment, the system 100 can generate the UI 501 with any level of granularity or specificity with respect to one or more actions so long as the system 100 is able to access enough training data for each specific configuration, as described above. For example, a user may want to incrementally increase or decrease (e.g., by 1-minute increments) the selected traffic light cycle 517 to assess the resultant impact or influence on the traffic density and/or flow. In this example, the system 100 can simulate the traffic as described above such that the user can see that after one hour (e.g., at 8:00 PM) the increase of the traffic light cycle around the stadium 503 considerably decreased congestion with respect to avenue 507, but greatly increased congestion with respect to streets 509 and 511.

Figure 5D:
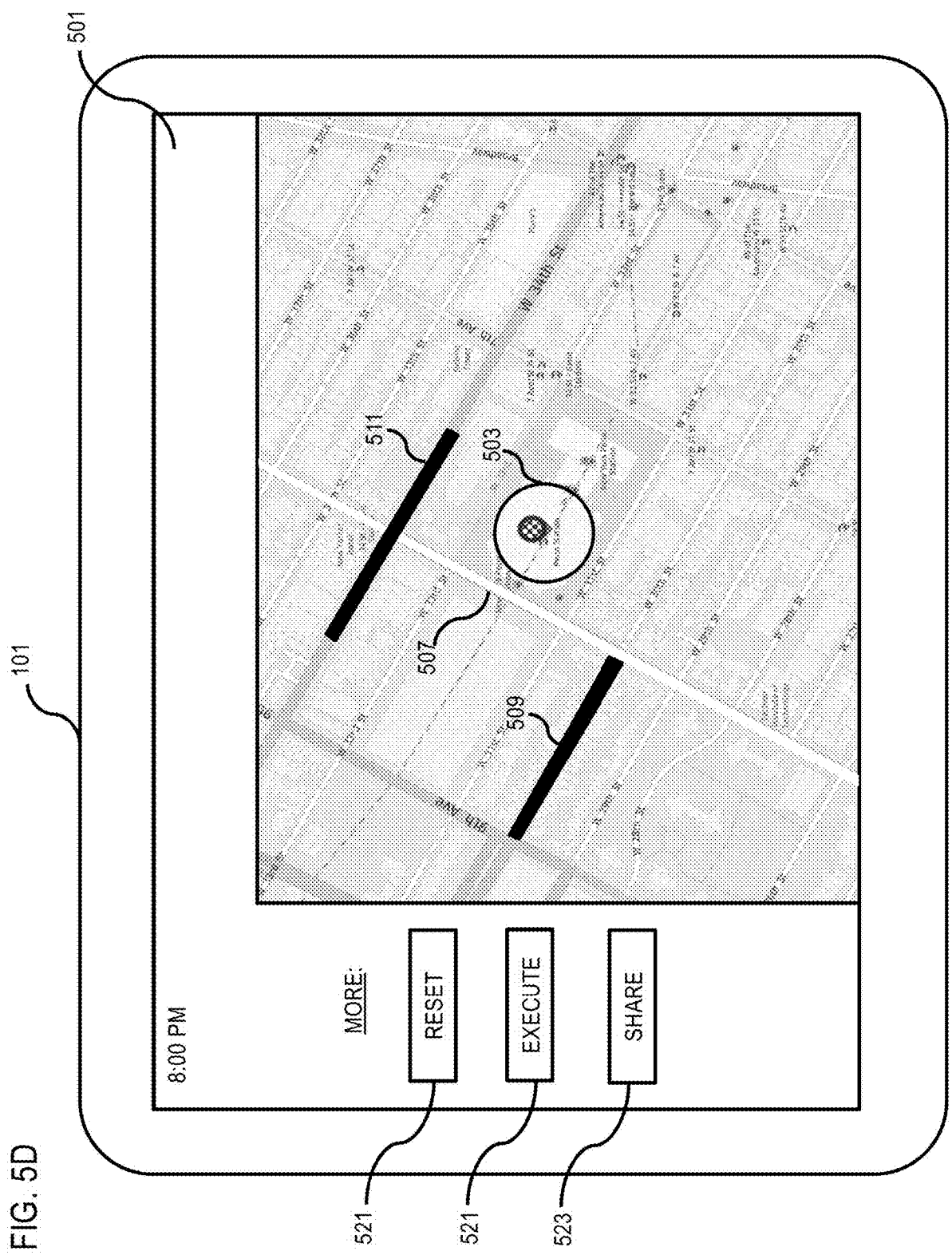
Figure 5E:
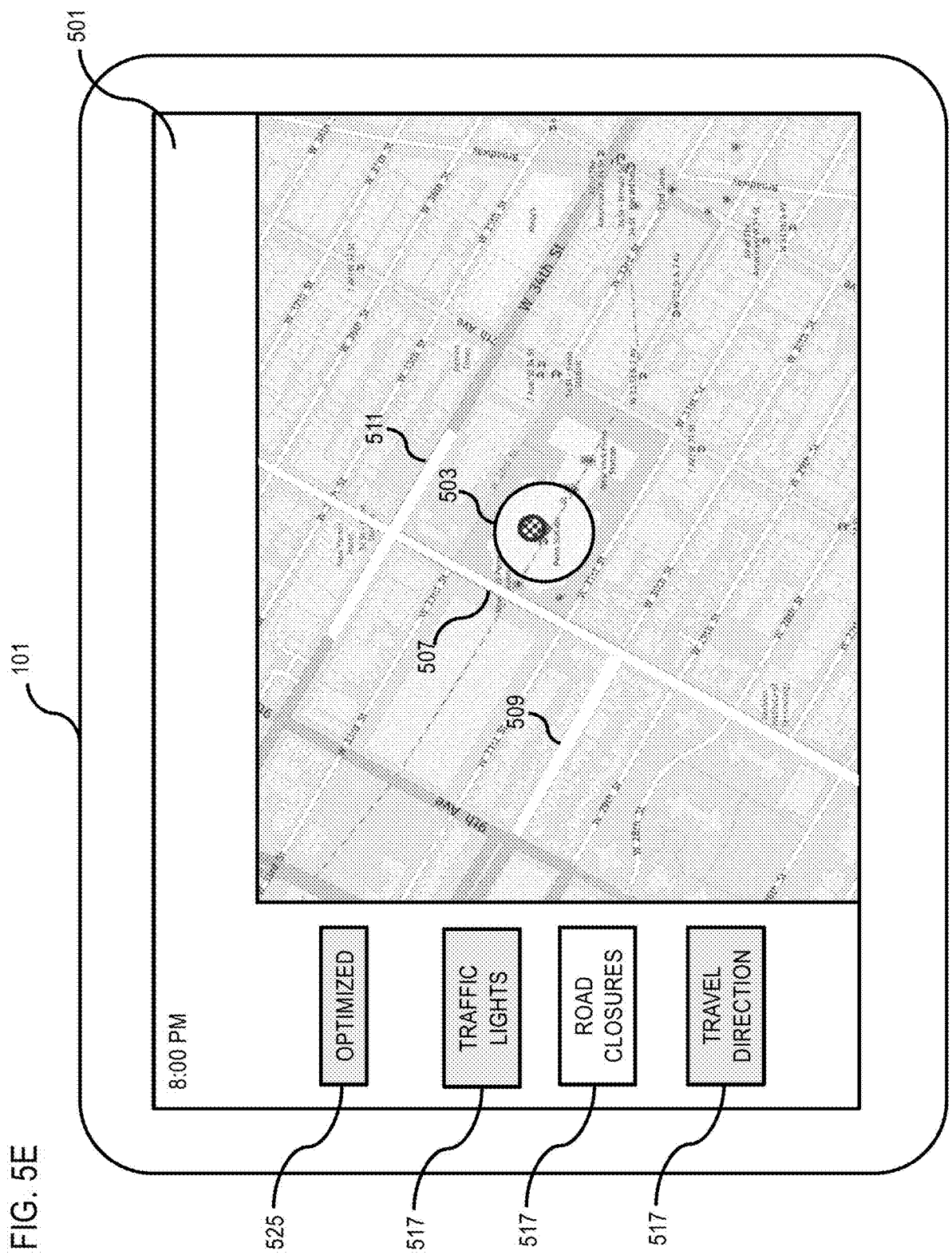

In one embodiment, the system 100 can generate the UI 501 such that it also includes inputs 521 to enable a user more or additional functionality, as depicted in the FIG. 5D. For example, the input 521 can enable the user to simulate a new traffic density (i.e., "reset" the prediction) or implement the configuration (i.e., "execute") if the UE 111 is connected to one or more infrastructure sensors 115 via the communication network 105. In one embodiment, the system 100 can also generate the UI 501 such that it includes an input 523 to enable a user to "share" the simulated traffic results and/or recommendations with one or more other users (e.g., a traffic authority in another a city facing a similar problem, an academic studying urban traffic, etc.).

In one embodiment, the system 100 can generate the UI 501 such that it includes an input 525 (e.g., "optimize") to enable a user to learn which proposed measures the predictive model (e.g., the machine learning model 119) has iteratively determined which would likely optimize traffic for a future time span (e.g., the next hour). In this example, the system 100 can show the user that one or more variations of Configuration 3 (e.g., "traffic lights—fast," and "travel direction—opposite") can minimize the number of street segments (e.g., segments 507, 509, and 511) with extreme traffic density. Although not shown in this example for illustrative convenience, it is contemplated that a user can still have access to the inputs 521 and 523 in order to reset, execute, and/or share, respectively, the proposed measures based on a machine learning model optimized prediction.

Returning to FIG. 1, in one embodiment, the vehicles 101 may be standard vehicles (e.g., a car), autonomous vehicles, or highly assisted driving (HAD) or semi-autonomous vehicles. Although the vehicles 101 are depicted as automobiles, it is contemplated that the vehicles 101 may be any type of vehicle (e.g., a car, a truck, a motorcycle, a bike, a scooter, a drone, etc.) which can include vehicle sensors 107 for providing location-based data and/or one or more infrastructural related inputs into the system 100.

By way of example, the vehicle sensors 107 may be any type of sensor. In certain embodiments, the vehicle sensors 107 may include, for example, a global positioning sensor (GPS) for gathering location data, a network detection sensor for detecting wireless signals or receivers for different short-range communications (e.g., Bluetooth, Wi-Fi, light fidelity (Li-Fi), near field communication (NFC) etc.), temporal information sensors, a camera/imaging sensor for gathering image data (e.g., lights or exhaust associated with a vehicle 101 leaving a parking spot), velocity sensors, and the like. In another embodiment, the vehicle sensors 107 may include sensors (e.g., mounted along a perimeter of the vehicle 101) to detect the relative distance of the vehicle from lanes or roadways, the presence of other vehicles 101, pedestrians, animals, traffic lights, road features (e.g., curves) and any other objects, or a combination thereof. In one scenario, the vehicle sensors 107 may detect weather data, traffic information, or a combination thereof. In one example embodiment, the vehicles 101 may include GPS receivers to obtain geographic coordinates from the satellites 127 for determining current or live location and time. Further, the location can be determined by a triangulation system such as A-GPS, Cell of Origin, or other location extrapolation technologies when cellular or network signals are available. In another example embodiment, the services 123 may provide in-vehicle navigation services.

In one embodiment, the UEs 111 can be associated with any of the vehicles 101, a driver or person traveling within a vehicle 101, a bicyclist, a pedestrian, or a combination thereof. By way of example, the UEs 111 can be any type of mobile terminal, fixed terminal, or portable terminal including a mobile handset, station, unit, device, multimedia computer, multimedia tablet, Internet node, communicator, desktop computer, laptop computer, notebook computer, netbook computer, tablet computer, personal communication system (PCS) device, personal navigation device, personal digital assistants (PDAs), audio/video player, digital camera/camcorder, positioning device, fitness device, television receiver, radio broadcast receiver, electronic book device, game device, devices associated with one or more vehicles or any combination thereof, including the accessories and peripherals of these devices, or any combination thereof. It is also contemplated that a UE 111 can support any type of interface to the user (such as "wearable" circuitry, etc.). In one embodiment, the vehicles 101 may have cellular or wireless fidelity (Wi-Fi) connection either through the inbuilt communication equipment or from a UE 111 associated with the vehicles 101. Also, the UEs 111 may be configured to access the communication network 105 by way of any known or still developing communication protocols. In one embodiment, the UEs 111 may include the simulation platform 103 to provide data-driven traffic simulations in a smart-city infrastructure.

By way of example, the one or more infrastructure sensors 115 may include cameras, weather sensors, vehicle counting sensors, GPS probes, traffic lights, etc. In other words, any device connected to the communication network 105 and that can create or provide an input to the system 100 regarding traffic under certain traffic management measures at a time.

In one embodiment, the simulation platform 103 performs the process for providing data-driven traffic simulations in a smart-city infrastructure as discussed with respect to the various embodiments described herein. In one embodiment, the simulation platform 103 can be a standalone server or a component of another device with connectivity to the communication network 105. For example, the component can be part of an edge computing network where remote computing devices (not shown) are installed along or within proximity of an intended destination (e.g., a city center).

In one embodiment, the simulation platform 103 has connectivity over the communication network 105 to the services platform 125 (e.g., an OEM platform) that provides one or more services 123a-123n (also collectively referred to herein as services 123) (e.g., traffic estimation and/or reporting services). By way of example, the services 123 may also be other third-party services (e.g., crow-sourced services) and include traffic reporting services, mapping services, navigation services, travel planning services, reservation services, notification services, social networking services, content (e.g., audio, video, images, etc.) provisioning services, application services, storage services, contextual information determination services, location-based services, information-based services (e.g., weather, news, etc.), etc.

In one embodiment, the content providers 121a-121k (also collectively referred to herein as content providers 121) may provide content or data (e.g., one or more configurations), additional or privileged data content available to a central traffic authority, content about the dynamic state of the traffic systems, content collected under specific configurations and tagged and/or annotated, navigation-based content such as destination information, routing instructions, POI related data, bulk historical traffic data, vehicle-based data, etc.) to the vehicles 101, the simulation platform 103, the UEs 111, the geographic database 113, the infrastructure sensors 115, the applications 117, the machine learning model 119, the services 123, and the services platform 125. The content provided may be any type of content, such as map content, contextual content, audio content, video content, image content, etc. In one embodiment, the content providers 121 may also store content associated with the vehicles 101, the simulation platform 103, the UEs 111, the geographic database 113, the infrastructure sensors 115, the applications 117, the machine learning model 119, the services 123, and/or the services platform 125. In another embodiment, the content providers 121 may manage access to a central repository of data, and offer a consistent, standard interface to data, such as a repository of the geographic database 113.

The communication network 105 of system 100 includes one or more networks such as a data network, a wireless network, a telephony network, or any combination thereof. It is contemplated that the data network may be any local area network (LAN), metropolitan area network (MAN), wide area network (WAN), a public data network (e.g., the Internet), short range wireless network, or any other suitable packet-switched network, such as a commercially owned, proprietary packet-switched network, e.g., a proprietary cable or fiber-optic network, and the like, or any combination thereof. In addition, the wireless network may be, for example, a cellular network and may employ various technologies including enhanced data rates for global evolution (EDGE), general packet radio service (GPRS), global system for mobile communications (GSM), Internet protocol multimedia subsystem (IMS), universal mobile telecommunications system (UMTS), etc., as well as any other suitable wireless medium, e.g., worldwide interoperability for microwave access (WiMAX), Long Term Evolution (LTE) networks, code division multiple access (CDMA), wideband code division multiple access (WCDMA), wireless fidelity (Wi-Fi), wireless LAN (WLAN), Bluetooth®, Internet Protocol (IP) data casting, satellite, mobile ad-hoc network (MANET), and the like, or any combination thereof.

In one embodiment, the simulation platform 103 may be a platform with multiple interconnected components. By way of example, the simulation platform 103 may include multiple servers, intelligent networking devices, computing devices, components and corresponding software for providing data-driven traffic simulations in a smart-city infrastructure. In addition, it is noted that the simulation platform 103 may be a separate entity of the system 100, a part of the content providers 121, the services 123, or the services platform 125.

In one embodiment, the geographic database 113 can store training traffic data collected from vehicles 101, the UEs 111, or a combination thereof and/or inputs or sensor data from one or more of the infrastructure sensors 115 (e.g., a smart traffic light). In one embodiment, the training traffic data is organized and/or separated based on the corresponding configuration under which the data was collected. In one embodiment, the geographic database 113 can also store road network models or routing graphs based on historic bulk traffic data as well as hypothetical routing graphs reflecting a specific configuration. In one instance, the geographic database 113 can store one or more distance functions (e.g., based on a Euclidean distance, a routing graph distance, or a combination thereof) for filtering training traffic data (e.g., in order to prevent the training data becoming too sparse). The information may be any of multiple types of information that can provide means for providing data-driven traffic simulations in a smart-city infrastructure. In another embodiment, the geographic database 113 may be in a cloud and/or in a vehicle 101, a UE 111, or a combination thereof.

By way of example, the vehicles 101, the simulation platform 103, the vehicle sensors 107, the UEs 111, the geographic database 113, the infrastructure sensors 115, the applications 117, the machine learning model 119, the content providers 121, the services 123, the services platform 125, and the satellites 127 communicate with each other and other components of the communication network 105 using well known, new or still developing protocols. In this context, a protocol includes a set of rules defining how the network nodes within the communication network 105 interact with each other based on information sent over the communication links. The protocols are effective at different layers of operation within each node, from generating and receiving physical signals of various types, to selecting a link for transferring those signals, to the format of information indicated by those signals, to identifying which software application executing on a computer system sends or receives the information. The conceptually different layers of protocols for exchanging information over a network are described in the Open Systems Interconnection (OSI) Reference Model.

Communications between the network nodes are typically effected by exchanging discrete packets of data. Each packet typically comprises (1) header information associated with a particular protocol, and (2) payload information that follows the header information and contains information that may be processed independently of that particular protocol. In some protocols, the packet includes (3) trailer information following the payload and indicating the end of the payload information. The header includes information such as the source of the packet, its destination, the length of the payload, and other properties used by the protocol. Often, the data in the payload for the particular protocol includes a header and payload for a different protocol associated with a different, higher layer of the OSI Reference Model. The header for a particular protocol typically indicates a type for the next protocol contained in its payload. The higher layer protocol is said to be encapsulated in the lower layer protocol. The headers included in a packet traversing multiple heterogeneous networks, such as the Internet, typically include a physical (layer 1) header, a data-link (layer 2) header, an internetwork (layer 3) header and a transport (layer 4) header, and various application (layer 5, layer 6 and layer 7) headers as defined by the OSI Reference Model.

Figure 6:
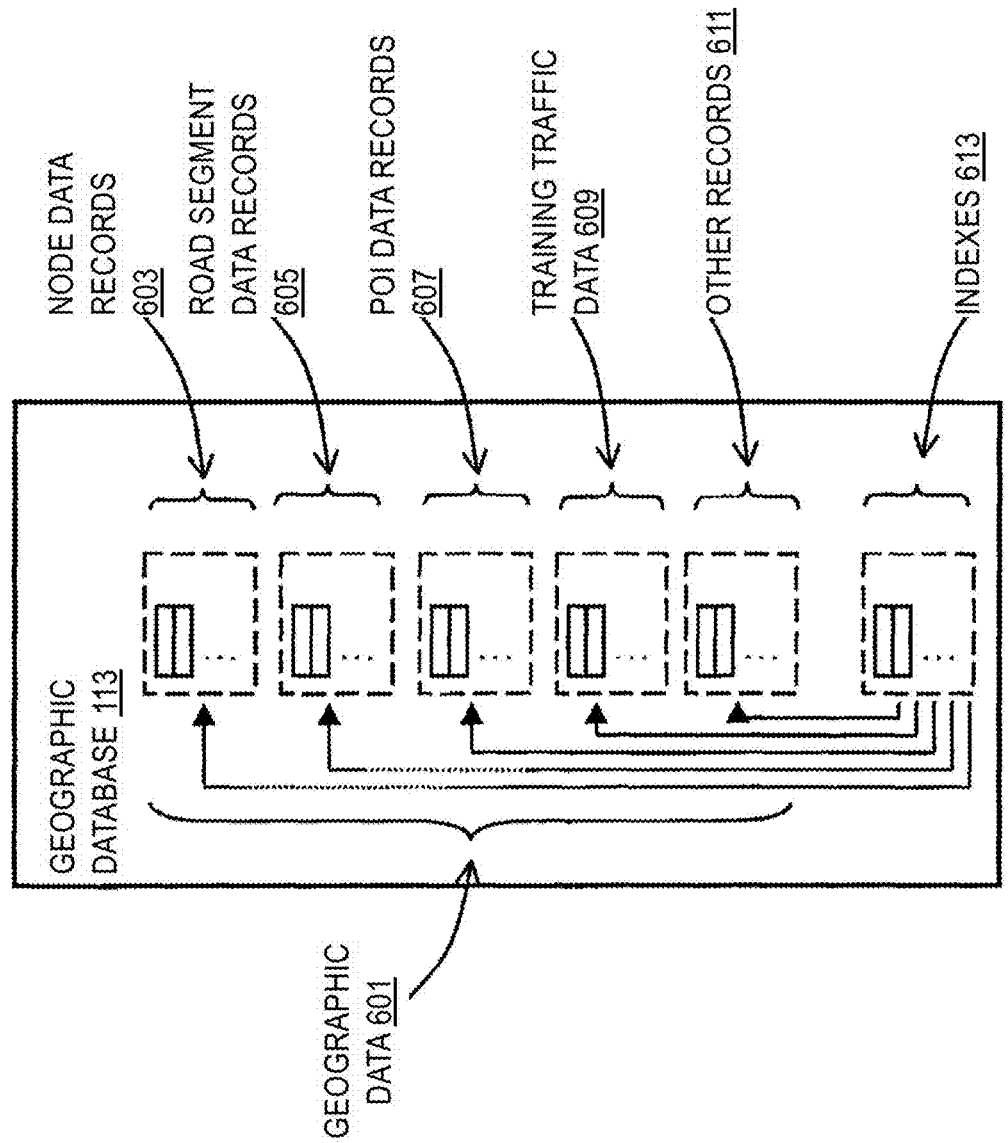
FIG. 6 is a diagram of a geographic database, according to one embodiment.

FIG. 6 is a diagram of a geographic database, according to one embodiment. In one embodiment, training traffic data collected (e.g., by the vehicles 101, the UEs 111, or a combination thereof) from a geographic area supported by a smart-city infrastructure with respect to providing data-driven traffic simulations in a smart-city infrastructure can be stored, associated with, and/or linked to the geographic database 113 or data thereof. In one embodiment, the geographic or map database 113 includes geographic data 601 used for (or configured to be compiled to be used for) mapping and/or navigation-related services, such as for route information, service information, on-street parking probability information, estimated time of arrival information, location sharing information, speed sharing information, and/or geospatial information sharing, according to exemplary embodiments. For example, the geographic database 117 includes node data records 603, road segment or link data records 605, POI data records 607, training traffic data 609, other data records 611, and indexes 613, for example. More, fewer or different data records can be provided. In one embodiment, the other data records 611 include cartographic ("carto") data records, routing data, and maneuver data. One or more portions, components, areas, layers, features, text, and/or symbols of the POI or event data can be stored in, linked to, and/or associated with one or more of these data records. For example, one or more portions of the POI, event data, or recorded route information can be matched with respective map or geographic records via position or GPS data associations (such as using known or future map matching or geo-coding techniques), for example. In one embodiment, the POI data records 607 may also include information on locations of traffic controls (e.g., stoplights, stop signs, crossings, etc.), driving restrictions (e.g., speed, direction of travel, etc.), parking restrictions (e.g., side of street, day of week, etc.), or a combination thereof.

In one embodiment, geographic features, e.g., two-dimensional or three-dimensional features, are represented using polygons, e.g., two-dimensional features, or polygon extrusions, e.g., three-dimensional features. For example, the edges of the polygons correspond to the boundaries or edges of the respective geographic feature. In the case of a building, a two-dimensional polygon can be used to represent a footprint of the building, and a three-dimensional polygon extrusion can be used to represent the three-dimensional surfaces of the building. It is contemplated that although various embodiments are discussed with respect to two-dimensional polygons, it is contemplated that the embodiments are also applicable to three-dimensional polygon extrusions. Accordingly, the terms polygons and polygon extrusions as used herein can be used interchangeably.

In one embodiment, the following terminology applies to the representation of geographic features in geographic database 113.

"Node"—A point that terminates a link.

"Line segment"—A straight line connecting two points.

"Link" (or "edge")—A contiguous, non-branching string of one or more-line segments terminating in a node at each end.

"Shape point"—A point along a link between two nodes, e.g., used to alter a shape of the link without defining new nodes.

"Oriented link"—A link that has a starting node (referred to as the "reference node") and an ending node (referred to as the "non-reference node").

"Simple polygon"—An interior area of an outer boundary formed by a string of oriented links that begins and ends in one node. In one embodiment, a simple polygon does not cross itself.

"Polygon"—An area bounded by an outer boundary and none or at least one interior boundary, e.g., a hole or island. In one embodiment, a polygon is constructed from one outer simple polygon and none or at least one inner simple polygon. A polygon is simple if it just consists of one simple polygon, or complex if it has at least one inner simple polygon.

In one embodiment, geographic database 113 follows certain conventions. For example, links do not cross themselves and do not cross each other except at a node. Also, there are no duplicated shape points, nodes, or links. Two links that connect each other have a common node. In geographic database 113, overlapping geographic features are represented by overlapping polygons. When polygons overlap, the boundary of one polygon crosses the boundary of the other polygon. In geographic database 113, the location at which the boundary of one polygon intersects they boundary of another polygon is represented by a node. In one embodiment, a node may be used to represent other locations along the boundary of a polygon than a location at which the boundary of the polygon intersects the boundary of another polygon. In one embodiment, a shape point is not used to represent a point at which the boundary of a polygon intersects the boundary of another polygon.

In exemplary embodiments, the road segment data records 605 are links or segments representing roads, streets, or paths, as can be used in the determining traffic light placement, road closures/lane closures, travel direction, speed limits, and/or lane assignments of a road network within a geographic area supported by a smart-city infrastructure. The node data records 603 are end points corresponding to the respective links or segments of the road segment data records 605. The road link data records 605 and the node data records 603 represent a road network, such as used by vehicles 101 (e.g., cars, bicycles, scooters, etc.) and/or other entities. Alternatively, the geographic database 113 can contain path segment and node data records or other data that represent pedestrian paths, bicycle paths, or areas in addition to or instead of the vehicle road record data, for example.

The road/link segments and nodes can be associated with attributes, such as functional class, a road elevation, a speed category, a presence or absence of road features, geographic coordinates, street names, address ranges, speed limits, turn restrictions at intersections, and other navigation related attributes, as well as POIs (e.g., general or personal POIs), such as home, office, a friend's house, gasoline stations, hotels, restaurants, museums, stadiums, offices, automobile dealerships, auto repair shops, buildings, stores, parks, etc. The geographic database 113 can include data about the POIs and their respective locations in the POI data records 607. In one instance, the POI data records 607 can include information regarding popular times at a POI, how long people typically spend at a POI, opening and closing times of a POI, etc. The geographic database 113 can also include data about places, such as cities, towns, or other communities, and other geographic features, such as bodies of water, mountain ranges, etc. Such place or feature data can be part of the POI data records 607 or can be associated with POIs or POI data records 607 (such as a data point used for displaying or representing a position of a city).

In one embodiment, the geographic database 113 can also include training traffic data 609. By way of example, the training traffic data 609 may be collected by vehicles 101, UEs 111, or a combination thereof as one or more vehicles 101, UEs 111, or a combination thereof travel a road network within a geographic area supported by a smart-city infrastructure. In one embodiment, the training traffic data 609 is obtained (e.g., using GPS sensors 107) under a specific configuration (e.g., training traffic data 609 collected under configuration 0, training traffic data 609 collected under configuration 1, etc.). In one embodiment, the machine learning model 119 is trained with only training traffic data 609 collected in similar configurations. As described above, the training traffic data 609 may include additional information available to a central traffic authority (e.g., a content provider 121) and/or may include information about the dynamic state of a traffic system at a time (e.g., traffic light cycles) allowing the conditioning or training of the machine learning model 119. By way of example, the training traffic data 609 can be associated with one or more of the node data records 603, road segment data records 605, and/or POI data records 607 in connection with providing data-driven traffic simulations in a smart-city infrastructure.

In one embodiment, the indexes 613 may improve the speed of data retrieval operations in geographic database 113. In one embodiment, the indexes 613 may be used to quickly locate data without having to search every row in geographic database 113 every time it is accessed. For example, in one embodiment, the indexes 613 can be a spatial index of the polygon points associated with stored feature polygons.

In one embodiment, the geographic database 113 can be maintained by a content provider 121 in association with the services platform 125, e.g., a map developer. The map developer can collect geographic data to generate and enhance geographic database 113. There can be different ways used by the map developer to collect data. These ways can include obtaining data from other sources, such as municipalities or respective geographic authorities. In addition, the map developer can employ field personnel to travel by vehicle (e.g., a vehicle 101) and/or travel with a UE 111 along roads throughout the geographic region to observe features and/or record information about them, for example. Also, remote sensing, such as aerial or satellite photography, can be used (e.g., using one or more satellites 127).

The geographic database 113 can be a master geographic database stored in a format that facilitates updating, maintenance, and development. For example, the master geographic database or data in the master geographic database can be in an Oracle spatial format or other spatial format, such as for development or production purposes. The Oracle spatial format or development/production database can be compiled into a delivery format, such as a geographic data files (GDF) format. The data in the production and/or delivery formats can be compiled or further compiled to form geographic database products or databases, which can be used in end user navigation devices or systems.

For example, geographic data is compiled (such as into a platform specification format (PSF) format) to organize and/or configure the data for performing navigation-related functions and/or services, such as route calculation, route guidance, map display, speed calculation, distance and travel time functions, and other functions, by a navigation device, such as by a UE 111 or a vehicle 101, for example. The navigation-related functions can correspond to vehicle navigation, pedestrian navigation, or other types of navigation. The compilation to produce the end user databases can be performed by a party or entity separate from the map developer. For example, a customer of the map developer, such as a navigation device developer or other end user device developer, can perform compilation on a received geographic database in a delivery format to produce one or more compiled navigation databases.

The processes described herein for providing data-driven traffic simulations in a smart-city infrastructure may be advantageously implemented via software, hardware, firmware or a combination of software and/or firmware and/or hardware. For example, the processes described herein, may be advantageously implemented via processor(s), Digital Signal Processing (DSP) chip, an Application Specific Integrated Circuit (ASIC), Field Programmable Gate Arrays (FPGAs), etc. Such exemplary hardware for performing the described functions is detailed below.

Figure 7:
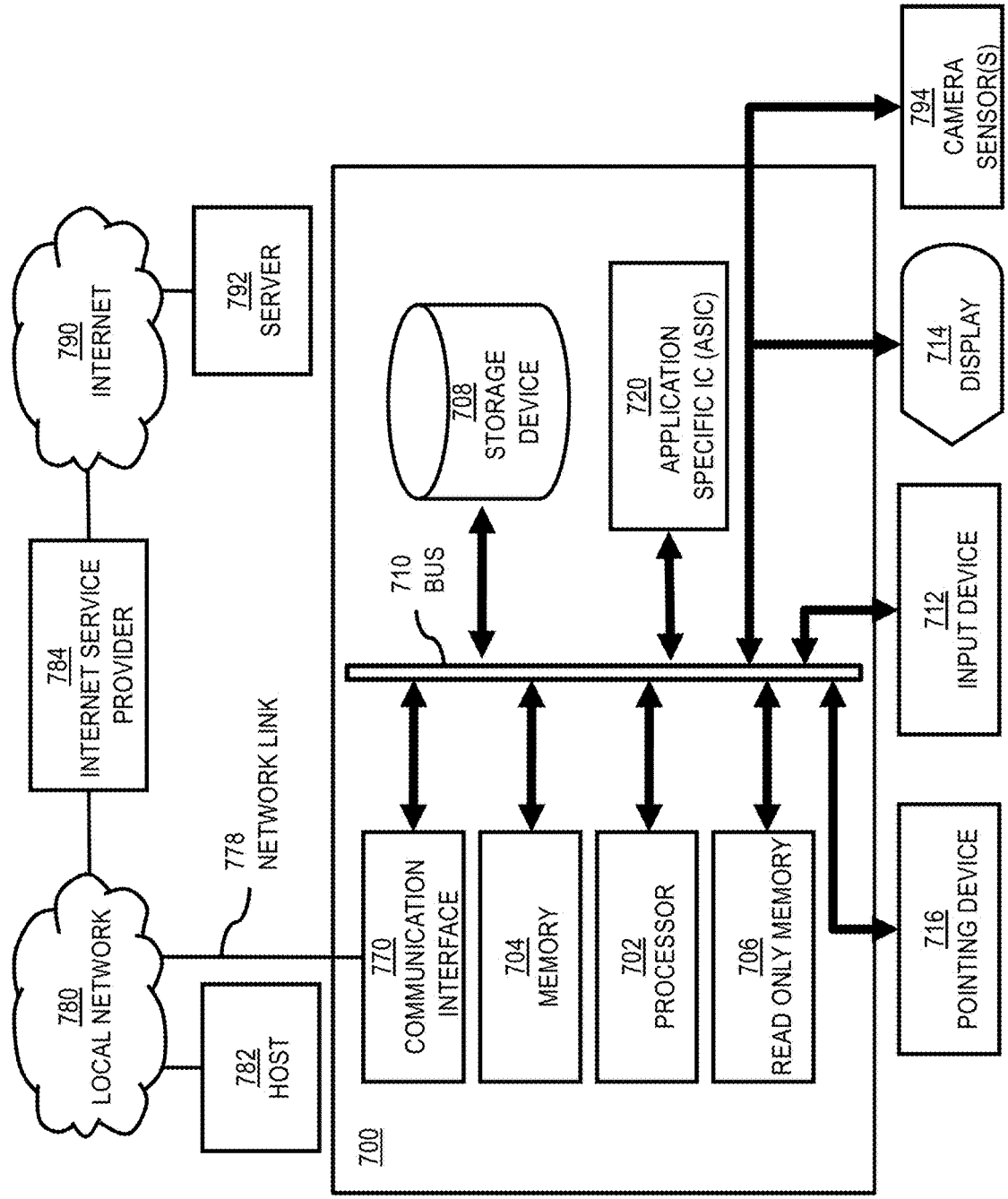
FIG. 7 is a diagram of hardware that can be used to implement an embodiment.

FIG. 7 illustrates a computer system 700 upon which an embodiment may be implemented. Computer system 700 is programmed (e.g., via computer program code or instructions) to provide data-driven traffic simulations in a smart-city infrastructure as described herein and includes a communication mechanism such as a bus 710 for passing information between other internal and external components of the computer system 700. Information (also called data) is represented as a physical expression of a measurable phenomenon, typically electric voltages, but including, in other embodiments, such phenomena as magnetic, electromagnetic, pressure, chemical, biological, molecular, atomic, sub-atomic and quantum interactions. For example, north and south magnetic fields, or a zero and non-zero electric voltage, represent two states (0, 1) of a binary digit (bit). Other phenomena can represent digits of a higher base. A superposition of multiple simultaneous quantum states before measurement represents a quantum bit (qubit). A sequence of one or more digits constitutes digital data that is used to represent a number or code for a character. In some embodiments, information called analog data is represented by a near continuum of measurable values within a particular range.

A bus 710 includes one or more parallel conductors of information so that information is transferred quickly among devices coupled to the bus 710. One or more processors 702 for processing information are coupled with the bus 710.

A processor 702 performs a set of operations on information as specified by computer program code related to providing data-driven traffic simulations in a smart-city infrastructure. The computer program code is a set of instructions or statements providing instructions for the operation of the processor and/or the computer system to perform specified functions. The code, for example, may be written in a computer programming language that is compiled into a native instruction set of the processor. The code may also be written directly using the native instruction set (e.g., machine language). The set of operations include bringing information in from the bus 710 and placing information on the bus 710. The set of operations also typically include comparing two or more units of information, shifting positions of units of information, and combining two or more units of information, such as by addition or multiplication or logical operations like OR, exclusive OR (XOR), and AND. Each operation of the set of operations that can be performed by the processor is represented to the processor by information called instructions, such as an operation code of one or more digits. A sequence of operations to be executed by the processor 702, such as a sequence of operation codes, constitute processor instructions, also called computer system instructions or, simply, computer instructions. Processors may be implemented as mechanical, electrical, magnetic, optical, chemical or quantum components, among others, alone or in combination.

Computer system 700 also includes a memory 704 coupled to bus 710. The memory 704, such as a random-access memory (RAM) or other dynamic storage device, stores information including processor instructions for providing data-driven traffic simulations in a smart-city infrastructure. Dynamic memory allows information stored therein to be changed by the computer system 700. RAM allows a unit of information stored at a location called a memory address to be stored and retrieved independently of information at neighboring addresses. The memory 704 is also used by the processor 702 to store temporary values during execution of processor instructions. The computer system 700 also includes a read only memory (ROM) 706 or other static storage device coupled to the bus 710 for storing static information, including instructions, that is not changed by the computer system 700. Some memory is composed of volatile storage that loses the information stored thereon when power is lost. Also coupled to bus 710 is a non-volatile (persistent) storage device 708, such as a magnetic disk, optical disk or flash card, for storing information, including instructions, that persists even when the computer system 700 is turned off or otherwise loses power.

Information, including instructions for providing data-driven traffic simulations in a smart-city infrastructure, is provided to the bus 710 for use by the processor from an external input device 712, such as a keyboard containing alphanumeric keys operated by a human user, or a sensor. A sensor detects conditions in its vicinity and transforms those detections into physical expression compatible with the measurable phenomenon used to represent information in computer system 700. Other external devices coupled to bus 710, used primarily for interacting with humans, include a display device 714, such as a cathode ray tube (CRT) or a liquid crystal display (LCD), or plasma screen or printer for presenting text or images, and a pointing device 716, such as a mouse or a trackball or cursor direction keys, or motion sensor, for controlling a position of a small cursor image presented on the display 714 and issuing commands associated with graphical elements presented on the display 714. In some embodiments, for example, in embodiments in which the computer system 700 performs all functions automatically without human input, one or more of external input device 712, display device 714 and pointing device 716 is omitted.

In the illustrated embodiment, special purpose hardware, such as an application specific integrated circuit (ASIC) 720, is coupled to bus 710. The special purpose hardware is configured to perform operations not performed by processor 702 quickly enough for special purposes. Examples of application specific ICs include graphics accelerator cards for generating images for display 714, cryptographic boards for encrypting and decrypting messages sent over a network, speech recognition, and interfaces to special external devices, such as robotic arms and medical scanning equipment that repeatedly perform some complex sequence of operations that are more efficiently implemented in hardware.

Computer system 700 also includes one or more instances of a communications interface 770 coupled to bus 710. Communication interface 770 provides a one-way or two-way communication coupling to a variety of external devices that operate with their own processors, such as printers, scanners and external disks. In general, the coupling is with a network link 778 that is connected to a local network 780 to which a variety of external devices with their own processors are connected. For example, communication interface 770 may be a parallel port or a serial port or a universal serial bus (USB) port on a personal computer. In some embodiments, communications interface 770 is an integrated services digital network (ISDN) card or a digital subscriber line (DSL) card or a telephone modem that provides an information communication connection to a corresponding type of telephone line. In some embodiments, a communication interface 770 is a cable modem that converts signals on bus 710 into signals for a communication connection over a coaxial cable or into optical signals for a communication connection over a fiber optic cable. As another example, communications interface 770 may be a local area network (LAN) card to provide a data communication connection to a compatible LAN, such as Ethernet. Wireless links may also be implemented. For wireless links, the communications interface 770 sends or receives or both sends and receives electrical, acoustic or electromagnetic signals, including infrared and optical signals, that carry information streams, such as digital data. For example, in wireless handheld devices, such as mobile telephones like cell phones, the communications interface 770 includes a radio band electromagnetic transmitter and receiver called a radio transceiver. In certain embodiments, the communications interface 770 enables connection to the communication network 105 for providing data-driven traffic simulations in a smart-city infrastructure.

The term non-transitory computer-readable medium is used herein to refer to any medium that participates in providing information to processor 702, including instructions for execution. Such a medium may take many forms, including, but not limited to, non-volatile media, volatile media and transmission media. Non-volatile or non-transitory media include, for example, optical or magnetic disks, such as storage device 708. Volatile media include, for example, dynamic memory 704. Transmission media include, for example, coaxial cables, copper wire, fiber optic cables, and carrier waves that travel through space without wires or cables, such as acoustic waves and electromagnetic waves, including radio, optical and infrared waves. Signals include man-made transient variations in amplitude, frequency, phase, polarization or other physical properties transmitted through the transmission media. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, an EPROM, a FLASH-EPROM, any other memory chip or cartridge, a carrier wave, or any other medium from which a computer can read.

In one embodiment, a non-transitory computer-readable storage medium carrying one or more sequences of one or more instructions (e.g., computer code) which, when executed by one or more processors (e.g., a processor as described in FIG. 5), cause an apparatus (e.g., the vehicles 101, the UEs 105, the simulation platform 103, etc.) to perform any steps of the various embodiments of the methods described herein.

FIG. 8 illustrates a chip set 800 upon which an embodiment may be implemented. Chip set 800 is programmed to provide data-driven traffic simulations in a smart-city infrastructure as described herein and includes, for instance, the processor and memory components described with respect to FIG. 7 incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in certain embodiments the chip set can be implemented in a single chip.

In one embodiment, the chip set 800 includes a communication mechanism such as a bus 801 for passing information among the components of the chip set 800. A processor 803 has connectivity to the bus 801 to execute instructions and process information stored in, for example, a memory 805. The processor 803 may include one or more processing cores with each core configured to perform independently. A multi-core processor enables multiprocessing within a single physical package. Examples of a multi-core processor include two, four, eight, or greater numbers of processing cores. Alternatively or in addition, the processor 803 may include one or more microprocessors configured in tandem via the bus 801 to enable independent execution of instructions, pipelining, and multithreading. The processor 803 may also be accompanied with one or more specialized components to perform certain processing functions and tasks such as one or more digital signal processors (DSP) 807, or one or more application-specific integrated circuits (ASIC) 809. A DSP 807 typically is configured to process real-world signals (e.g., sound) in real time independently of the processor 803. Similarly, an ASIC 809 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 803 and accompanying components have connectivity to the memory 805 via the bus 801. The memory 805 includes both dynamic memory (e.g., RAM, magnetic disk, writable optical disk, etc.) and static memory (e.g., ROM, CD-ROM, etc.) for storing executable instructions that when executed perform the inventive steps described herein to provide data-driven traffic simulations in a smart-city infrastructure. The memory 805 also stores the data associated with or generated by the execution of the inventive steps.

FIG. 9 is a diagram of exemplary components of a mobile terminal 901 (e.g., handset or vehicle or part thereof) capable of operating in the system of FIG. 1, according to one embodiment. Generally, a radio receiver is often defined in terms of front-end and back-end characteristics. The front-end of the receiver encompasses all of the Radio Frequency (RF) circuitry whereas the back-end encompasses all of the base-band processing circuitry. Pertinent internal components of the telephone include a Main Control Unit (MCU) 903, a Digital Signal Processor (DSP) 905, and a receiver/transmitter unit including a microphone gain control unit and a speaker gain control unit. A main display unit 907 provides a display to the user in support of various applications and mobile station functions that offer automatic contact matching. An audio function circuitry 909 includes a microphone 911 and microphone amplifier that amplifies the speech signal output from the microphone 911. The amplified speech signal output from the microphone 911 is fed to a coder/decoder (CODEC) 913.

A radio section 915 amplifies power and converts frequency in order to communicate with a base station, which is included in a mobile communication system, via antenna 917. The power amplifier (PA) 919 and the transmitter/modulation circuitry are operationally responsive to the MCU 903, with an output from the PA 919 coupled to the duplexer 921 or circulator or antenna switch, as known in the art. The PA 919 also couples to a battery interface and power control unit 920.

In use, a user of mobile station 901 speaks into the microphone 911 and his or her voice along with any detected background noise is converted into an analog voltage. The analog voltage is then converted into a digital signal through the Analog to Digital Converter (ADC) 923. The control unit 903 routes the digital signal into the DSP 905 for processing therein, such as speech encoding, channel encoding, encrypting, and interleaving. In one embodiment, the processed voice signals are encoded, by units not separately shown, using a cellular transmission protocol such as global evolution (EDGE), general packet radio service (GPRS), global system for mobile communications (GSM), Internet protocol multimedia subsystem (IMS), universal mobile telecommunications system (UMTS), etc., as well as any other suitable wireless medium, e.g., microwave access (WiMAX), Long Term Evolution (LTE) networks, code division multiple access (CDMA), WiFi, satellite, and the like.

The encoded signals are then routed to an equalizer 925 for compensation of any frequency-dependent impairments that occur during transmission though the air such as phase and amplitude distortion. After equalizing the bit stream, the modulator 927 combines the signal with a RF signal generated in the RF interface 929. The modulator 927 generates a sine wave by way of frequency or phase modulation. In order to prepare the signal for transmission, an up-converter 931 combines the sine wave output from the modulator 927 with another sine wave generated by a synthesizer 933 to achieve the desired frequency of transmission. The signal is then sent through a PA 919 to increase the signal to an appropriate power level. In practical systems, the PA 919 acts as a variable gain amplifier whose gain is controlled by the DSP 905 from information received from a network base station. The signal is then filtered within the duplexer 921 and optionally sent to an antenna coupler 935 to match impedances to provide maximum power transfer. Finally, the signal is transmitted via antenna 917 to a local base station. An automatic gain control (AGC) can be supplied to control the gain of the final stages of the receiver. The signals may be forwarded from there to a remote telephone which may be another cellular telephone, other mobile phone or a land-line connected to a Public Switched Telephone Network (PSTN), or other telephony networks.

Voice signals transmitted to the mobile station 901 are received via antenna 917 and immediately amplified by a low noise amplifier (LNA) 937. A down-converter 939 lowers the carrier frequency while the demodulator 941 strips away the RF leaving only a digital bit stream. The signal then goes through the equalizer 925 and is processed by the DSP 905. A Digital to Analog Converter (DAC) 943 converts the signal and the resulting output is transmitted to the user through the speaker 945, all under control of a Main Control Unit (MCU) 903—which can be implemented as a Central Processing Unit (CPU) (not shown).

The MCU 903 receives various signals including input signals from the keyboard 947. The keyboard 947 and/or the MCU 903 in combination with other user input components (e.g., the microphone 911) comprise a user interface circuitry for managing user input. The MCU 903 runs a user interface software to facilitate user control of at least some functions of the mobile station 901 to provide data-driven traffic simulations in a smart-city infrastructure. The MCU 903 also delivers a display command and a switch command to the display 907 and to the speech output switching controller, respectively. Further, the MCU 903 exchanges information with the DSP 905 and can access an optionally incorporated SIM card 949 and a memory 951. In addition, the MCU 903 executes various control functions required of the station. The DSP 905 may, depending upon the implementation, perform any of a variety of conventional digital processing functions on the voice signals. Additionally, DSP 905 determines the background noise level of the local environment from the signals detected by microphone 911 and sets the gain of microphone 911 to a level selected to compensate for the natural tendency of the user of the mobile station 901.

The CODEC 913 includes the ADC 923 and DAC 943. The memory 951 stores various data including call incoming tone data and is capable of storing other data including music data received via, e.g., the global Internet. The software module could reside in RAM memory, flash memory, registers, or any other form of writable non-transitory computer readable storage medium known in the art. The memory device 951 may be, but not limited to, a single memory, CD, DVD, ROM, RAM, EEPROM, optical storage, or any other non-volatile storage medium capable of storing digital data.

An optionally incorporated SIM card 949 carries, for instance, important information, such as the cellular phone number, the carrier supplying service, subscription details, and security information. The SIM card 949 serves primarily to identify the mobile station 901 on a radio network. The card 949 also contains a memory for storing a personal telephone number registry, text messages, and user specific mobile station settings.

While the invention has been described in connection with a number of embodiments and implementations, the invention is not so limited but covers various obvious modifications and equivalent arrangements, which fall within the purview of the appended claims. Although features of the invention are expressed in certain combinations among the claims, it is contemplated that these features can be arranged in any combination and order.

What is claimed is:

1. A method for providing traffic simulation in a smart-city infrastructure comprising:
   retrieving training traffic data collected from a geographic area supported by the smart-city infrastructure;
   determining one or more configurations of the smart-city infrastructure corresponding to one or more times at which the training traffic data was collected, wherein the one or more configurations indicate respective states of one or more traffic-related actions supported by the smart-city infrastructure; and training a predictive model to predict a traffic-related key performance indicator based on the training traffic data and the one or more configurations, wherein the predictive model is used to predict the traffic-related key performance indicator for a reconfiguration of at least one of the one or more traffic-related actions.

2. The method of claim 1, wherein the predictive model is trained separately for a corresponding configuration of the one or more configurations, the predictive model outputting one or more other traffic-related key performance indicators for the corresponding one or more configurations, wherein a score is derived for the traffic-related key performance indicator and the one or more other traffic-related key performance indicators, wherein the score is used to train the predictive model to recommend the one or more traffic-related actions.

3. The method of claim 1, further comprising:
determining one or more candidate state changes for the reconfiguration;
determining a corresponding configuration from the one or more configurations that represent the one or more candidate state changes;
using the predictive model that has been trained for the corresponding configuration to predict respective simulated traffic data at a designated future time after each of the one or more candidate state changes are applied to the smart-city infrastructure and to predict a respective traffic-related key performance indicator for said each of the one or more candidate state changes based on the respective simulated traffic data; and
providing at least one of the one or more candidate state changes as a recommendation for the reconfiguration based on the respective traffic-related key performance indicator for said each of the one or more candidate state changes.

4. The method of claim 1, wherein the one or more traffic-related actions include at least one of:
re-assigning a direction of a road lane;
closing or opening a road;
changing a speed limit; and
changing a traffic light cycle.

5. The method of claim 1, wherein the traffic-related key performance indicator includes at least one of:
minimizing an overall average traffic density; and
minimizing a number of street segments with a traffic density above a threshold value.

6. The method of claim 1, wherein an amount of the training traffic data that is available in the geographic area is below a threshold value, the method further comprising:
using a routing graph in place of the training traffic data to train the predictive model.

7. The method of claim 6, further comprising:
determining that the amount of the training traffic data is below the threshold based on a proxy condition,
wherein the proxy condition includes at least one of:
an initial system start;
an evaluation of a hypothetical new action; and
a consideration of a long-term change.

8. The method of claim 1, further comprising:
determining whether a value of the training traffic data changes with an alteration of the one or more configurations; and
excluding the training traffic data, the one or more configurations, or a combination thereof from the training of the predictive model when the change of the value is below a threshold.

9. The method of claim 8, wherein the threshold is based on a range, a proximity, a Euclidean distance, a routing graph distance, or a combination thereof.

10. The method of claim 1, wherein the training traffic data is retrieved from a first source and the one or more configurations are retrieved from a second source.

11. An apparatus for providing traffic simulation in a smart-city infrastructure comprising:
at least one processor; and
at least one memory including computer program code for one or more programs,
the at least one memory and the computer program code configured to, with the at least one processor, cause the apparatus to perform at least the following,
retrieve training traffic data collected from a geographic area supported by the smart-city infrastructure;
determine one or more configurations of the smart-city infrastructure corresponding to one or more times at which the training traffic data was collected, wherein the one or more configurations indicate respective states of one or more traffic-related actions supported by the smart-city infrastructure; and
train a predictive model to predict a traffic-related key performance indicator based on the training traffic data and the one or more configurations,
wherein the predictive model is used to predict the traffic-related key performance indicator for a reconfiguration of at least one of the one or more traffic-related actions.

12. The apparatus of claim 11, wherein the predictive model is trained separately for a corresponding configuration of the one or more configurations, the predictive model outputting one or more other traffic-related key performance indicators for the corresponding one or more configurations, wherein a score is derived for the traffic-related key performance indicator and the one or more other traffic-related key performance indicators, wherein the score is used to train the predictive model to recommend the one or more traffic-related actions.

13. The apparatus of claim 11, wherein the apparatus is further caused to:
determine one or more candidate state changes for the reconfiguration;
determine a corresponding configuration from the one or more configurations that represent the one or more candidate state changes;
use the predictive model that has been trained for the corresponding configuration to predict respective simulated traffic data at a designated future time after each of the one or more candidate state changes are applied to the smart-city infrastructure and to predict a respective traffic-related key performance indicator for said each of the one or more candidate state changes based on the respective simulated traffic data; and
provide at least one of the one or more candidate state changes as a recommendation for the reconfiguration based on the respective traffic-related key performance indicator for said each of the one or more candidate state changes.

14. The apparatus of claim 11, wherein the one or more traffic-related actions include at least one of:
re-assigning a direction of a road lane;
closing or opening a road;
changing a speed limit; and
changing a traffic light cycle.

15. The apparatus of claim 11, wherein the traffic-related key performance indicator includes at least one of:

minimizing an overall average traffic density;
minimizing a number of street segments with a traffic density above a threshold value.

16. The apparatus of claim 11, wherein an amount of the training traffic data that is available in the geographic area is below a threshold value, the apparatus is further caused to:
use a routing graph in place of the training traffic data to train the predictive model.

17. A non-transitory computer-readable storage medium for providing traffic simulation in a smart-city infrastructure, carrying one or more sequences of one or more instructions which, when executed by one or more processors, cause an apparatus to at least perform the following steps:
retrieving training traffic data collected from a geographic area supported by the smart-city infrastructure;
determining one or more configurations of the smart-city infrastructure corresponding to one or more times at which the training traffic data was collected, wherein the one or more configurations indicate respective states of one or more traffic-related actions supported by the smart-city infrastructure; and
training a predictive model to predict a traffic-related key performance indicator based on the training traffic data and the one or more configurations, wherein the traffic-related key performance indicator includes minimizing an overall average traffic density,
wherein the predictive model is used to predict the traffic-related key performance indicator for a reconfiguration of at least one of the one or more traffic-related actions.

18. The non-transitory computer-readable storage medium of claim 17, wherein the predictive model is trained separately for a corresponding configuration of the one or more configurations, the predictive model outputting one or more other traffic-related key performance indicators for the corresponding one or more configurations, wherein a score is derived for the traffic-related key performance indicator and the one or more other traffic-related key performance indicators, wherein the score is used to train the predictive model to recommend the one or more traffic-related actions.

19. The non-transitory computer-readable storage medium of claim 17, wherein the apparatus is further caused to perform:
determining one or more candidate state changes for the reconfiguration;
determining a corresponding configuration from the one or more configurations that represent the one or more candidate state changes;
using the predictive model that has been trained for the corresponding configuration to predict respective simulated traffic data at a designated future time after each of the one or more candidate state changes are applied to the smart-city infrastructure and to predict a respective traffic-related key performance indicator for said each of the one or more candidate state changes based on the respective simulated traffic data; and
providing at least one of the one or more candidate state changes as a recommendation for the reconfiguration based on the respective traffic-related key performance indicator for said each of the one or more candidate state changes.

20. The non-transitory computer-readable storage medium of claim 17, wherein the one or more traffic-related actions include at least one of:
re-assigning a direction of a road lane;
closing or opening a road;
changing a speed limit; and
changing a traffic light cycle.

\* \* \* \* \*